(12) United States Patent
Alkhalil et al.

(10) Patent No.: US 11,637,210 B2
(45) Date of Patent: Apr. 25, 2023

(54) SCHOTTKY DIODE

(71) Applicant: PRAGMATIC PRINTING LTD, Sedgefield (GB)

(72) Inventors: Feras Alkhalil, Cambridge (GB); Richard Price, Cambridge (GB); Brian Cobb, Cambridge (GB)

(73) Assignee: PRAGMATIC PRINTING LTD, Sedgefield (GB)

( * ) Notice: Subject to any disclaimer, the term of this patent is extended or adjusted under 35 U.S.C. 154(b) by 139 days.

(21) Appl. No.: 16/771,400

(22) PCT Filed: Dec. 11, 2018

(86) PCT No.: PCT/GB2018/053588
§ 371 (c)(1),
(2) Date: Jun. 10, 2020

(87) PCT Pub. No.: WO2019/116020
PCT Pub. Date: Jun. 20, 2019

(65) Prior Publication Data
US 2020/0350441 A1 Nov. 5, 2020

(30) Foreign Application Priority Data

Dec. 11, 2017 (GB) ..................... 1720630

(51) Int. Cl.
*H01L 29/872* (2006.01)
*H01L 27/06* (2006.01)
(Continued)

(52) U.S. Cl.
CPC ........ *H01L 29/872* (2013.01); *H01L 27/0629* (2013.01); *H01L 29/417* (2013.01);
(Continued)

(58) Field of Classification Search
CPC ............ H01L 29/872; H01L 29/66969; H01L 27/0629
(Continued)

(56) References Cited

U.S. PATENT DOCUMENTS 4,098,921 A 7/1978 Calviello
4,674,177 A 6/1987 Calviello
(Continued)

FOREIGN PATENT DOCUMENTS

DE 102011122119 A1 9/2012
GB 1044722 A 10/1966
(Continued)

OTHER PUBLICATIONS

Chasin, Adrian et al "An Integrated a-IGZO UHF Energy Harvester for Passive RFID Tags" (Color Version) IEEE Transactions on Electron Devices; vol. 61, No. 9; Sep. 2014; pp. 3289-3295.
(Continued)

*Primary Examiner* — Monica D Harrison
(74) *Attorney, Agent, or Firm* — Jason H. Vick; Sheridan Ross, PC

(57) ABSTRACT

A Schottky diode comprises: a first electrode; a second electrode; and a body of semiconductive material connected to the first electrode at a first interface and connected to the second electrode at a second interface, wherein the first interface comprises a first planar region lying in a first plane and the first electrode has a first projection onto the first plane in a first direction normal to the first plane, the second interface comprises a second planar region lying in a second plane and the second electrode has a second projection onto the first plane in said first direction, at least a portion of the second projection lies outside the first projection, said second planar region is offset from the first planar region in said
(Continued)

first direction, and one of the first interface and the second interface provides a Schottky contact.

9 Claims, 19 Drawing Sheets

(51) Int. Cl.

| | | |
|---|---|---|
| H01L 29/417 | (2006.01) | |
| H01L 29/47 | (2006.01) | |
| H01L 29/66 | (2006.01) | |
| H01L 29/786 | (2006.01) | |
| H01L 51/05 | (2006.01) | |
| H01L 29/16 | (2006.01) | |
| H01L 29/20 | (2006.01) | |
| H01L 29/22 | (2006.01) | |
| H01L 29/24 | (2006.01) | |

(52) U.S. Cl.
CPC ........ *H01L 29/47* (2013.01); *H01L 29/66143* (2013.01); *H01L 29/66212* (2013.01); *H01L 29/66969* (2013.01); *H01L 29/7869* (2013.01); *H01L 51/0579* (2013.01); *H01L 29/1604* (2013.01); *H01L 29/2003* (2013.01); *H01L 29/22* (2013.01); *H01L 29/242* (2013.01)

(58) Field of Classification Search
USPC ........................................................ 257/471
See application file for complete search history.

(56) References Cited

U.S. PATENT DOCUMENTS

| 8,193,594 | B2* | 6/2012 | Yu | .......................... | H01L 45/00 |
|---|---|---|---|---|---|
| | | | | | 257/104 |
| 2005/0161760 | A1 | 7/2005 | Templier et al. | | |
| 2008/0105870 | A1 | 5/2008 | Yu et al. | | |
| 2010/0059761 | A1 | 3/2010 | Horii et al. | | |
| 2010/0140660 | A1 | 6/2010 | Wu et al. | | |
| 2011/0147761 | A1 | 6/2011 | Yu et al. | | |
| 2015/0325659 | A1 | 11/2015 | Hitora et al. | | |
| 2016/0071936 | A1 | 3/2016 | Eon et al. | | |
| 2016/0197202 | A1 | 7/2016 | Tomai et al. | | |
| 2017/0194451 | A1 | 7/2017 | Hua et al. | | |

FOREIGN PATENT DOCUMENTS

| JP | S59-208877 | A | 11/1984 |
|---|---|---|---|
| JP | S61-161776 | A | 7/1986 |
| JP | S62-156863 | A | 7/1987 |
| JP | S63-45869 | A | 2/1988 |
| JP | S63-66966 | A | 3/1988 |
| JP | 2005-531127 | A | 10/2005 |
| JP | 2006-165532 | A | 6/2006 |
| JP | 2007-134684 | A | 5/2007 |
| JP | 2016-522988 | A | 8/2016 |
| KR | 10-2016-0043967 | A | 4/2016 |

OTHER PUBLICATIONS

Chasin, Adrian et al "Integrated UHF a-IGZO Energy Harvester for Passive RFID Tags" (Color Version) IEEE Transactions on Electron Devices; vol. 61, No. 9; Sep. 2014; pp. 3289-3295.
Search Report Under Section 17 for Great Britain Patent Application No. 2202977.1, dated Mar. 21, 2022.
Examination Report Under Section 18(3) for Great Britain Patent Application No. 2107321.8, dated Apr. 20, 2022.
Examination Report Under Sections 17 and 18(3) for Great Britain Patent Application No. 2203439.1, dated Apr. 20, 2022.
Chasin, Adrian et al. "Gigahertz Operation of a-IGZO Schottky Diodes" IEEE Transactions on Electron Devices, vol. 60, No. 10, Oct. 2013; pp. 3407-3412.
Chasin, Adrian et al "An Integrated a-IGZO UHF Energy Harvester for Passive RFID Tags" IEEE Transactions on Electron Devices; vol. 61, No. 9; Sep. 2014; pp. 3289-3295.
Chou, Tse-Heng et al. "Improving Hydrogen Detection Performance of a Pd/n-LTPS/glass Thin Film Schottky Diode with a $TiO_2$ Interface Layer" Sensors and Actuators B; vol. 134, No. 2, Sep. 25, 2008.
Huang, H.Y., et al. "InGaZnO Metal-Base Transistor with High Current Gain" Electronics Letters, vol. 50, No. 20, Sep. 25, 2014; pp. 1465-1467.
Hussin, Rozana et al. "Thin Film $In_{0.53}Ga_{0.47}As$ Schottky Diodes for Rectification and Photodetection of 28.3 THz Radiations" 2017 75th Annual Device Research Conference (DRC), IEEE, Jun. 25, 2017.
Invitation to Pay Additional Fees and, Where Applicable, Protest Fees for International Application No. PCT/GB2018/053588, dated Feb. 12, 2019.
International Search Report for International Application No. PCT/GB2018/053588, dated Apr. 30, 2019.
Written Opinion for International Application No. PCT/GB2018/053588, dated Apr. 30, 2019.
Search Report, for Great Britain Patent Application No. 1720630.1, dated Jun. 12, 2018.
International Preliminary Report on Patentability for International Application No. PCT/GB2018/053588, dated Jun. 25, 2020.
Examination Report for Great Britain Patent Application No. 1820159.0, dated May 23, 2019.
Office Action for corresponding European Application No. 18819363.5, dated Jun. 30, 2021.
Kang, He et al. "High-Voltage AlGaN/GaN-Based Lateral Schottky Barrier Diodes" Chin. Phys. Lett.; vol. 31, No. 6; 2014.
Singh, Yashvir "Lateral Thin-Film Schottky (LTFS) Rectifier on SOI: A Device with Higher than Plane Parallel Breakdown Voltage" IEEE Transactions on Electron Devices; vol. 49, No. 1; Jan. 2002.
Yue, Lili et al. "Study of the Characteristics of a Schottky Diode Prepared by Using Ag on $Mg_xZn_{1-x}O$ Films with Mg Content" New Physics: Sae Mulli, vol. 67, No. 3; Mar. 2017.
Notification of the Reasons for Rejection (Including Translation) for corresponding Korean Patent Application No. 10-2020-7018944, dated Nov. 18, 2022.
Notice of Reasons for Refusal (Including Translation) for corresponding Japanese Patent Application No. 2020-550925, dated Dec. 27, 2022.

* cited by examiner

Main Device Cross section and top View
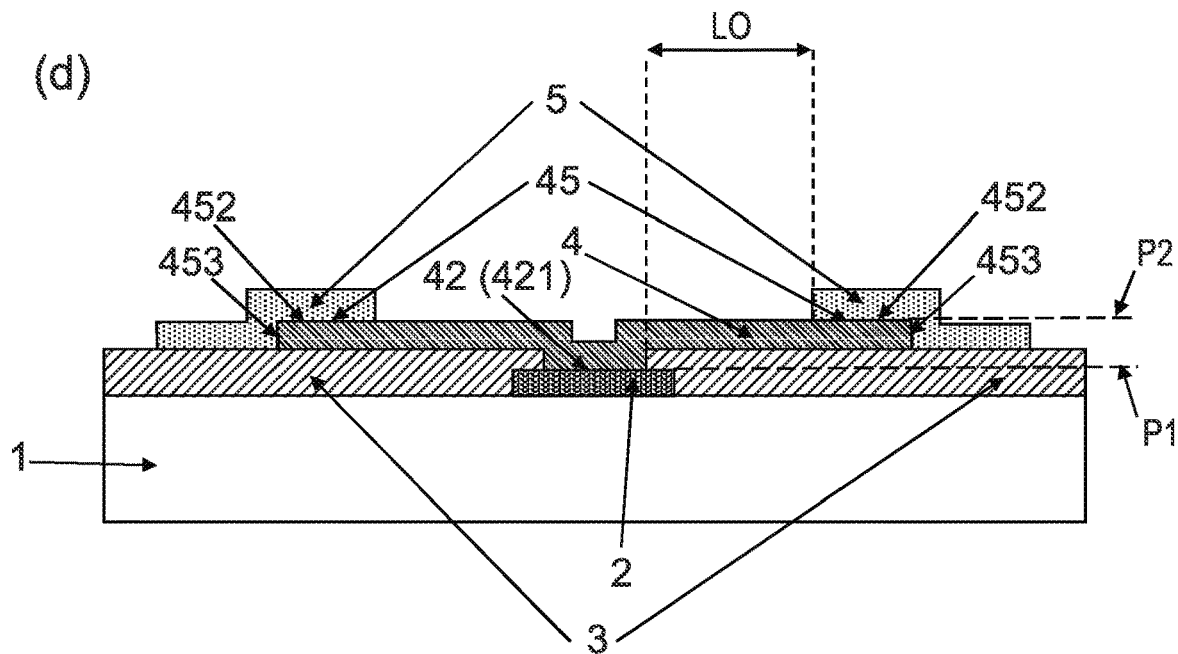
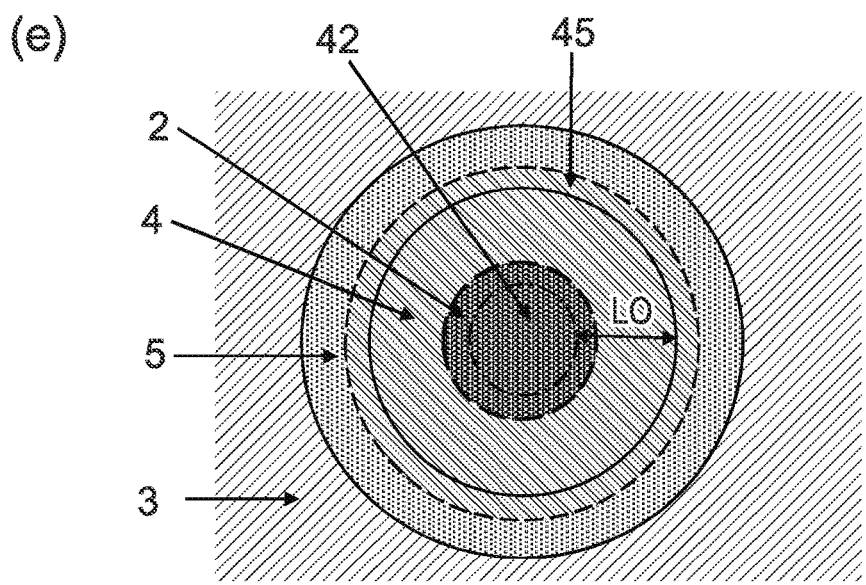
FIG. 1 (Continued)
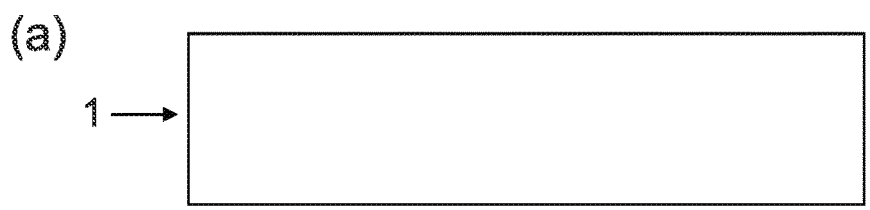
FIG. 2 Substrate First electrode Deposition and Pattern transfer First electrode Deposition and Pattern transfer Dielectric Deposition and Pattern transfer Semiconductor Deposition and Pattern Transfer Second electrode deposition and Pattern transfer Second electrode deposition and Pattern transfer Main device without DIEL Main device with partial overlap Main device with full overlap Main device with surface modification of the bottom electrode Main device with Two Semiconductor, or Doping/Surface modification of top layer of Semiconductor Main device with a different Semiconductor, Doping/Surface modification of top layer of Semiconductor at the second electrode region

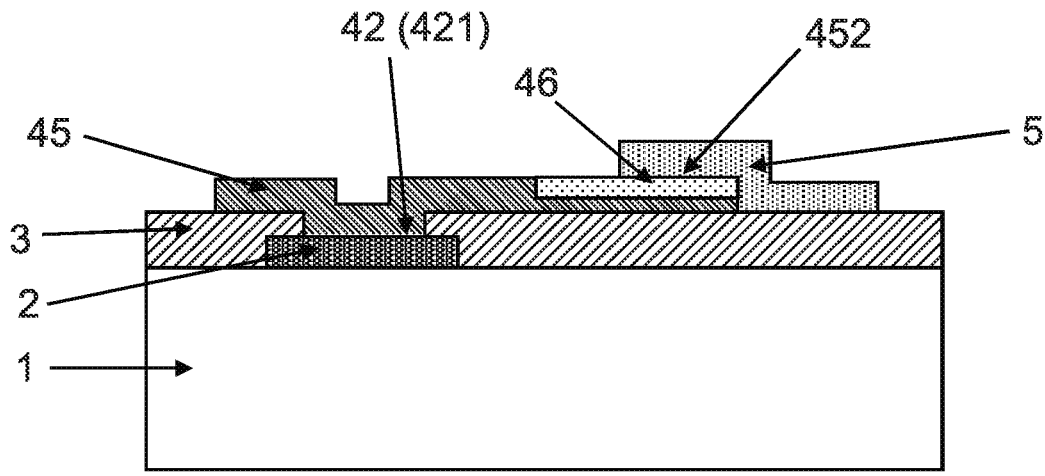

FIG. 8(b)

Current Voltage Characteristics of a Lateral Schottky Diode, wherein the second interface is offset from the first interface such that a projection of the second interface onto the first plane does not overlap the first interface.

Lateral Schottky Diode Current Voltage Characteristics

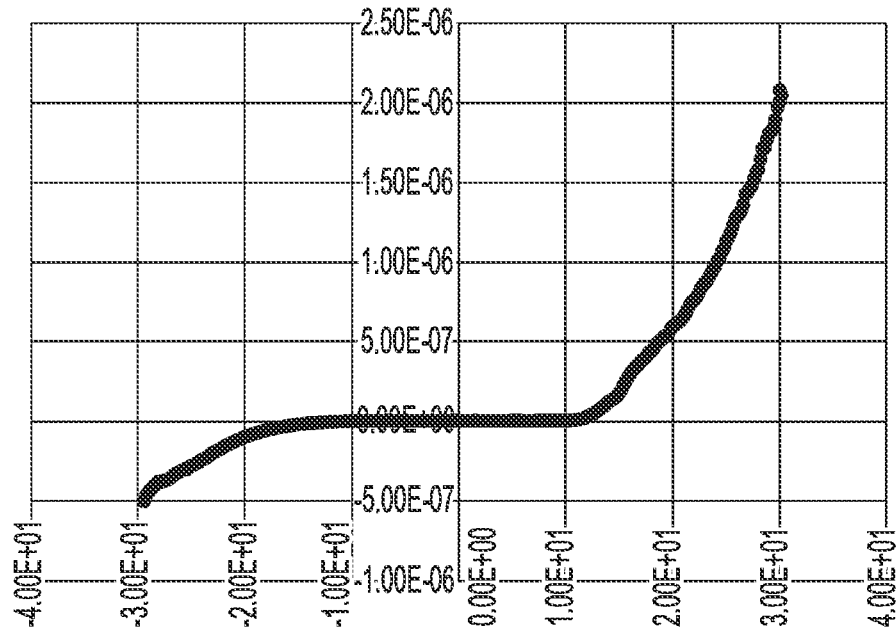

FIG. 9(a)

Current Voltage Characteristics of a Lateral Schottky Diode, wherein the second interface is offset from the first interface such that a projection of the second interface onto the first plane overlaps the first interface Lateral Schottky Diode Current Voltage Characteristics Full Wave Rectifier circuit

SCHOTTKY DIODE

CROSS-REFERENCE TO RELATED APPLICATIONS

This application is a national stage application under 35 U.S.C. 371 of PCT Application No. PCT/GB2018/053588, having an international filing date of 11 Dec. 2018, which designated the United States, which PCT application claimed the benefit of Great Britain Application No. 1720630.1, filed 11 Dec. 2017, each of which are incorporated herein by reference in their entirety.

FIELD OF THE INVENTION

The present invention relates to Schottky diodes and their methods of manufacture. In particular, although not exclusively, certain embodiments of the present invention are concerned with Schottky diodes for incorporation in thin and/or flexible electronic circuits, and certain embodiments are concerned with thin-film Schottky diodes for such applications or other applications.

BACKGROUND TO THE INVENTION

Schottky diodes are well-known electronic components, typically providing very fast switching from their conducting to non-conducting states and hence they are particularly good for rectifying high frequency signals. Schottky diodes are also well-known for use in numerous other electronic applications and circuit configurations.

A Schottky diode comprises two conductive electrodes (one Schottky and one ohmic) separated either laterally or vertically by a semiconductor. In flexible electronics, Schottky diodes have been demonstrated with several different materials systems including metal oxides and organic semiconductors. A vertical diode consists of parallel plate conductors separated by a semiconducting layer whereas a lateral diode usually consists of two electrodes in the same plane, covered by a semiconductor.

Control of the Schottky barrier height is achieved by optimising the difference between the workfunction of the Schottky electrode and Fermi level of the semiconductor. This can be achieved through the choice of conductor for the Schottky electrode and/or control of the Fermi energy through modification to the semiconductor material (oxygen content in the case of metal oxides).

In the vertical diode configuration, the difficulties revolve around achieving a stable and reproducible barrier height using a semiconductor sandwiched between metal contacts. The variability arises due to surface defects at the metal-semiconductor interfaces, which can have a significant effect on the threshold voltage, breakdown voltage and RC time constant. An additional key challenge for metal oxide semiconductor vertical stacks is caused by oxygen reduction. To create an ohmic contact at the top surface, for example, typically a conductor is chosen that locally reduces the metal oxide. If the metal oxide semiconductor is too thin and/or has too low an oxygen content, this can result in a conductive pathway to the Schottky electrode, leading to early device breakdown.

Lateral diode structures offer improved control over the current path from the ohmic contact through the semiconductor to the Schottky contact. Lateral separation of the contacts becomes a key controlling factor with a lower impact therefore of the semiconductor thickness or its oxygen content. With lateral diodes, however, etch selectivity issues may constrain the choice of the two different metals for the Schottky and ohmic electrodes/contacts.

SUMMARY OF THE INVENTION

Certain embodiments of the present invention aim to overcome, at least partly, at least one of the problems associated with the prior art. Certain embodiments aim to provide Schottky diodes suitable for use in thin and/or flexible electronic circuits, and certain embodiments aim to provide thin-film Schottky diodes. Certain embodiments aim to provide methods of manufacturing Schottky diodes, those methods being compatible with techniques used in the production of thin and/or flexible electronic circuits and circuit components.

In accordance with a first aspect of the present invention there is provided a Schottky diode comprising: a first electrode; a second electrode; and a body (e.g. a layer) of semiconductive material connected to the first electrode at (by) a first interface (junction) and connected to the second electrode at (by) a second interface (junction), wherein the first interface comprises a first planar region lying in a first plane and the first electrode has a first projection onto the first plane in a first direction normal to the first plane, the second interface comprises a second planar region lying in a second plane and the second electrode has a second projection onto the first plane in said first direction, at least a portion of the second projection lies outside the first projection, said second planar region is offset (separated, spaced) from the first planar region in said first direction, and one of the first interface and the second interface provides a Schottky (rectifying) contact.

In certain embodiments the first electrode is a lower electrode and the second electrode is an upper electrode, for example relative to a substrate or other support. In certain alternative embodiments the first electrode is an upper electrode and the second electrode is a lower electrode.

In certain embodiments the diode further comprises a substrate, for example supporting the electrodes and body of semiconductive material.

In certain embodiments, said second plane is parallel to said first plane.

In certain embodiments, said first interface consists of said first planar region.

In certain embodiments, said second interface consists of said second planar region.

In certain embodiments, said second projection lies entirely (completely) outside said first projection, whereby a projection, in the first direction, of the second planar region onto the first plane lies completely outside a projection, in the first direction, of the first planar region onto the first plane.

In certain embodiments, a portion of said first projection lies inside said second projection.

In certain embodiments, all of said first projection lies inside said second projection.

In certain embodiments, a projection, in the first direction, of the second planar region onto the first plane lies completely outside a projection, in the first direction, of the first planar region onto the first plane.

In certain embodiments, a portion (part) of a projection, in the first direction, of the first planar region onto the first plane lies inside a projection, in the first direction, of the second planar region onto the first plane.

In certain embodiments, all of a projection, in the first direction, of the first planar region onto the first plane lies inside a projection, in the first direction, of the second planar region onto the first plane.

In certain embodiments, the diode further comprises a substrate, said first electrode being arranged on a surface of said substrate.

In certain embodiments, the diode further comprises a body (e.g. a layer) of dielectric material (e.g. a dielectric layer).

In certain embodiments, said dielectric body is arranged to space (separate) the second electrode from the first electrode in said first direction.

In certain embodiments, said dielectric body comprises a window, and said first interface is arranged inside said window.

In certain embodiments, said body of semiconductive material comprises a first portion, at least partly filling said window, and a second portion extending laterally (i.e. in a direction parallel to the first plane) from the window and covering at least a portion of a surface of said dielectric body.

In certain embodiments, said second electrode is arranged to cover at least part of the second portion of the dielectric body.

In certain embodiments, the diode further comprises a further body (e.g. layer) of dielectric material arranged to cover at least part of the body of semiconductive material and at least part of the second electrode.

In certain embodiments, the further body of dielectric material is arranged to cover all of the body of semiconductive material.

In certain embodiments, at least one of the first and second interfaces comprises a surface processed portion of at least one of: the first electrode; the second electrode; and the body of semiconductive material.

In accordance with another aspect of the invention there is provided a Schottky diode comprising: a first electrode; a second electrode; and a body (e.g. a layer) of semiconductive material connected to the first electrode at (by) a first interface (junction) and connected to the second electrode at (by) a second interface (junction), wherein the first interface comprises a first planar region lying in a first plane and the first interface has a first projection onto the first plane in a first direction normal to the first plane, the second interface comprises a second planar region lying in a second plane and the second interface has a second projection onto the first plane in said first direction, at least a portion of the second projection lies outside the first projection, said second planar region is offset (separated, spaced) from the first planar region in said first direction, and one of the first interface and the second interface provides a Schottky (rectifying) contact.

In accordance with another aspect of the invention there is provided a Schottky diode comprising: a first electrode; a second electrode; and a body of semiconductive material connected to the first electrode at (by) a first interface (junction) and connected to the second electrode at (by) a second interface (junction), wherein the first interface comprises a first planar region lying in a first plane and the first electrode has a first projection onto the first plane in a first direction normal to the first plane, the second interface comprises a second planar region and the second electrode has a second projection onto the first plane in said first direction, said second projection lies entirely outside the first projection, one of the first interface and the second interface provides a Schottky (rectifying) contact, said body comprises a first side and a second side, said second side being spaced from the first side by a thickness of said body in said first direction, and said first planar region being on said first side of the body and said second planar region being on said second side of the body.

In certain embodiments, said second planar region lies in said first plane.

In certain embodiments, said second planar region lies in a second plane.

In certain embodiments, said second plane is parallel to said first plane.

In certain embodiments, said second plane is spaced from said first plane in said first direction.

In certain embodiments, the diode further comprises a substrate arranged to support the first electrode.

In certain embodiments, the body of semiconductive material comprises a first portion, arranged to cover at least a portion of a surface of the first electrode, and a second portion extending laterally from the first electrode, and the second electrode is arranged to cover at least a portion of the second portion of the body of semiconductive material.

In certain embodiments, the diode further comprises a further body (e.g. layer) of dielectric material arranged to cover at least part of the body of semiconductive material and at least part of the second electrode.

In certain embodiments, the further body of dielectric material is arranged to cover all of the body of semiconductive material.

In certain embodiments, at least one of the first and second interfaces comprises a processed (e.g. surface-processed) portion of at least one of: the first electrode; the second electrode; and the body of semiconductive material.

In certain embodiments, the body of semiconductive material comprises a first layer and a second layer, the first interface comprising a portion (e.g. surface portion) of the first layer, and the second interface comprising a portion of the second layer.

Another aspect of the present invention provides a Schottky diode comprising: a first electrode; a second electrode; and a body of semiconductive material connected to the first electrode at a first interface (junction) and connected to the second electrode at a second interface (junction), wherein the first interface is substantially planar, lying in a first plane, and the second interface is offset (separated) from the first interface in a first direction normal to the first plane and in a second direction parallel to the first plane.

In certain embodiments the second interface is offset from the first interface such that a projection of the second interface onto the first plane does not overlap the first interface. In alternative embodiments, there is partial overlap, and in further embodiments there is full overlap.

In certain embodiments, said projection of the second interface onto the first plane is separated from the first interface by a distance of at least 1 nm, but the actual separation will depend on many factors, for example the minimum feature size achievable by the fabrication process/lithography tools, and desired device parameters as discussed in this specification.

In certain embodiments said second interface is substantially planar, lying in a second plane, and the second plane may be parallel to the first plane.

In certain embodiments, the diode further comprises a layer of dielectric material, wherein said body of semiconductive material comprises a first portion extending from said first interface in a direction normal to said first plane and through the layer of dielectric material to a surface of the layer of dielectric material, and a second portion extending in a direction parallel to said first plane, along said surface.

In certain embodiments the second electrode overlaps an end of said second portion and a portion of said surface.

In certain embodiments the first interface comprises a first portion of a substantially planar surface of the first electrode, and the layer of dielectric material covers (overlaps) at least a second portion of said substantially planar surface of the first electrode.

In certain embodiments first interface is a Schottky junction and said second junction is an ohmic junction, and in alternative embodiments the second interface is a Schottky junction and said first junction is an ohmic junction. In certain embodiments one of the first and second interfaces is a Schottky junction and the other of the first and second interfaces is any junction that allows current to flow through the Schottky diode when the Schottky junction is conducting.

In certain embodiments the first electrode comprises or consists of a first material selected from a list comprising: a metal such as Au, Ti, Al, Mo, Pt, Pd, Ag, Cu, Ni, Cr, Ta, W; a metal alloy such as MoNi, MoCr, AlSi; a transparent conductive oxide (such as ITO, IZO, AZO); a metal nitride such as TiN; a carbon material such as carbon black, carbon nanotubes, graphene; a conducting polymer such as polyaniline, PEDOT:PSS; or a semiconductor material.

In certain embodiments the second electrode comprises or consists of a second material selected from a list comprising: a metal such as Au, Ti, Al, Mo, Pt, Pd, Ag, Cu, Ni, Cr, Ta, W; a metal alloy such as MoNi, MoCr, AlSi; a transparent conductive oxide (such as ITO, IZO, AZO); a metal nitride such as TiN; a carbon material such as carbon black, carbon nanotubes, graphene; a conducting polymer such as polyaniline, PEDOT:PSS; or a semiconductor material.

In certain embodiments the semiconductive material comprises or consists of a material selected from a list comprising: compound semiconductors (such as GaAs, GaN, InP, CdSe, InGaAs, InGaAsSb), metal oxides such as ZnO, $SnO_2$, NiO, SnO, $Cu_2O$, $In_2O_3$, LiZnO, ZnSnO, InSnO (ITO), InZnO (IZO), HfInZnO (HIZO), InGaZnO (IGZO) (sometimes referred to as GaInZnO, GIZO); metal oxynitrides, e.g. $Zn_xO_yN_z$; inorganic semiconductors (such as amorphous, microcrystalline or nanocrystalline Si); organic semiconductors (such as CuPc, pentacene, PTCDA, methylene blue, Orange G, rubrene); polymer semiconductors (such as PEDOT:PSS, POT, P3OT, P3HT, polyaniline, polycarbazole); 2D materials (such as graphene); chalcogenides such as $MoS_2$, GeSbTe; and perovskites ($SrTiO_3$, $CH_3NH_3PbCl_3$, $H_2NCHNH_2PbCl_3$, $CsSnI_3$); any of the preceding semiconductor materials, also doped or containing a doping gradient, and either n-type or p-type.

Examples of suitable materials for the dielectric material and/or substrate in certain embodiments are provided in the following description.

In certain embodiments, at least the semiconductive material and first and second electrodes are substantially transparent at least to visible light.

In certain embodiments, the semiconductive material is substantially transparent at least to visible light but the first and second electrodes are at least partially reflective of visible light.

In certain embodiments, said dielectric material is substantially transparent at least to visible light.

In certain embodiments, one of the first and second electrodes comprises a body (e.g. layer) of titanium and a layer comprising, or consisting of, at least one titanium oxide or suboxide formed on a surface of said body of titanium, wherein the interface providing the Schottky contact comprises or consists of an interface between the body of semiconductive material and said layer comprising, or consisting of, at least one titanium oxide or suboxide.

Another aspect of the present invention provides a circuit comprising at least a first diode in accordance with any preceding aspect or embodiment, and a second diode in accordance with any preceding aspect or embodiment, wherein the first and second planar regions of the first diode are offset (i.e. from each other) by a first distance and the first and second planar regions of the second diode are offset by a second distance, said second distance being different from the first distance.

Another aspect of the present invention provides a circuit, or circuit module, comprising a diode in accordance with any preceding aspect or embodiment. For example, the circuit, or circuit module, may be a logic gate (e.g. an OR gate, and AND gate etc.), or an inverter (such as a diode load inverter).

In certain embodiments, the circuit is an integrated circuit.

Another aspect of the present invention provides an electronic device comprising a diode in accordance with any preceding aspect or embodiment. For example, the device may be a source-gated transistor, a Schottky transistor, a gated diode, etc.

Another aspect of the invention provides a method of manufacturing a Schottky diode comprising a first electrode, a second electrode, and a body of semiconductive material connecting the first and second electrodes, the method comprising: forming a first electrode on a first region of a substrate (or support) surface; forming a body of dielectric material covering at least a second region of the substrate surface adjacent the first region; forming a body of semiconductive material comprising a first portion, arranged over the first electrode and connected to the first electrode at a first interface, and a second portion arranged over a portion of the body of dielectric material covering said second region of the substrate surface; and forming a second electrode on said second portion of the body of semiconductive material, the second electrode being connected to the body of semiconductive material at a second interface.

In certain embodiments, the first interface has a first projection on the substrate surface, the second interface has a second projection on the substrate surface, and the second projection is offset from the first projection by a distance.

In certain embodiments, the method further comprises pre-determining said distance according to at least one desired characteristic or parameter of the diode.

In certain embodiments, the first interface comprises a first surface portion of the first electrode, and the method further comprises processing said first surface portion of the first electrode before forming the body of semiconductive material.

In certain embodiments, the second interface comprises a surface portion of the body of semiconductive material, and the method further comprises processing said surface portion of the body of semiconductive material before forming the second electrode.

In certain embodiments, said body of semiconductive material comprises at least two layers.

In certain embodiments, the method further comprises selectively processing at least one portion of the body of semiconductive material (e.g. impanting ions).

In certain embodiments, said body of dielectric material covers a portion of the first electrode.

In certain embodiments, said body of dielectric material comprises a window through which at least a portion of the first electrode is visible (exposed) and said first portion of the body of semiconductive material is formed inside said window.

Another aspect of the invention provides a method of manufacturing a Schottky diode comprising a first electrode, a second electrode, and a body of semiconductive material connecting the first and second electrodes, the method comprising: forming a first electrode on a first region of a substrate (or support) surface; forming a body of semiconductive material comprising a first portion, arranged over the first electrode and connected to the first electrode at a first interface, and a second portion arranged over a second region of the substrate surface adjacent the first region; and forming a second electrode on said second portion of the body of semiconductive material, the second electrode being connected to the body of semiconductive material at a second interface. Features of the above-mentioned aspects and embodiments of the invention may be employed in this aspect with corresponding advantage.

Another aspect of the invention provides a method of manufacturing a Schottky diode comprising a first electrode, a second electrode, and a body of semiconductive material connecting the first and second electrodes, the method comprising: forming a first electrode on a first region of a substrate (or support) surface; forming a second electrode on a second region of the substrate surface, the second region being separated from the first region by a third region; forming a body of semiconductive material comprising a first portion, arranged over the first electrode and connected to the first electrode at a first interface, a second portion arranged over the second electrode and connected to the second electrode at a second interface, and a third portion arranged over the third region and connecting the first portion to the second portion. Again, features of the above-mentioned aspects and embodiments of the invention may be employed in this aspect with corresponding advantage.

In certain embodiments, the first interface comprises a first surface portion of the first electrode, and the method further comprises processing said first surface portion of the first electrode before forming the body of semiconductive material.

In certain embodiments, the second interface comprises a first surface portion of the second electrode, and the method further comprises processing said first surface portion of the second electrode before forming the body of semiconductive material.

In certain embodiments, said forming of the first electrode and said forming of the second electrode are performed at the same time.

In certain embodiments, said forming of the first electrode is performed before or after said forming of the second electrode.

In certain embodiments of any of the above-mentioned aspects, the method may further comprise implanting ions to dope, or increase the doping of, at least a portion of the body of semiconductive material.

In certain embodiments of any of the above-mentioned aspects, the first electrode comprises a body of titanium and said processing of said first surface portion of the first electrode comprises processing said first surface portion of the first electrode to form a layer comprising, or consisting of, at least one titanium oxide or suboxide.

Another aspect of the present invention provides a method of manufacturing a Schottky diode comprising a first electrode, a second electrode, and a body of semiconductive material connecting the first and second electrodes, the method comprising: forming a first electrode having a substantially planar (upper) surface; forming a layer of dielectric material having a substantially planar (upper) surface parallel to the substantially planar surface of the first electrode and having a window through which at least a portion of the planar surface of the first electrode is visible/exposed; forming a body of semiconductive material having a substantially planar (upper) surface, the body of semiconductive material comprising a first portion filling said window and a second portion extending laterally from said window so as to cover a portion of the substantially planar (upper) surface of the layer of dielectric material; and forming a second electrode on said second portion.

In certain embodiments of any of the above-mentioned aspects the method may further comprise processing the/a surface of the first electrode (e.g. performing surface engineering on the first electrode) and/or the surface of the second electrode to modify the work-function and/or introduce a barrier. This processing may include implantation, plasma treatment, SAM deposition, ALD, ozone UV, laser exposure, thermal annealing, etc. One may select a process that is selective only to the first electrode in certain embodiments.

In certain embodiments the diode includes a top dielectric layer. This may allow selective deposition of the second electrode into a window in the top dielectric layer. Additionally, it may provide protection to the semiconductor both during and after processing of the second electrode.

In certain embodiments, the first electrode is formed from a first conductive material and the second electrode is formed from a second conductive material, different from the first material.

Another aspect of the present invention provides a Schottky diode comprising:
a first electrode;
a second electrode; and
a body of semiconductive material connected to the first electrode at a first interface and connected to the second electrode at a second interface,
wherein the first interface provides a Schottky contact, the first electrode comprises a body (e.g. layer) of titanium and a layer comprising, or consisting of, at least one titanium oxide or suboxide formed on a surface of said body of titanium, and said first interface comprises or consists of an interface between the body of semiconductive material and said layer comprising, or consisting of, at least one titanium oxide or suboxide.

In certain embodiments, said semiconductive material is an oxide semiconductor, for example IGZO.

BRIEF DESCRIPTION OF THE DRAWINGS

Embodiments of certain aspects of the invention will now be described with reference to the accompanying drawings, in which.

DETAILED DESCRIPTION OF CERTAIN EMBODIMENTS

Figure 1:
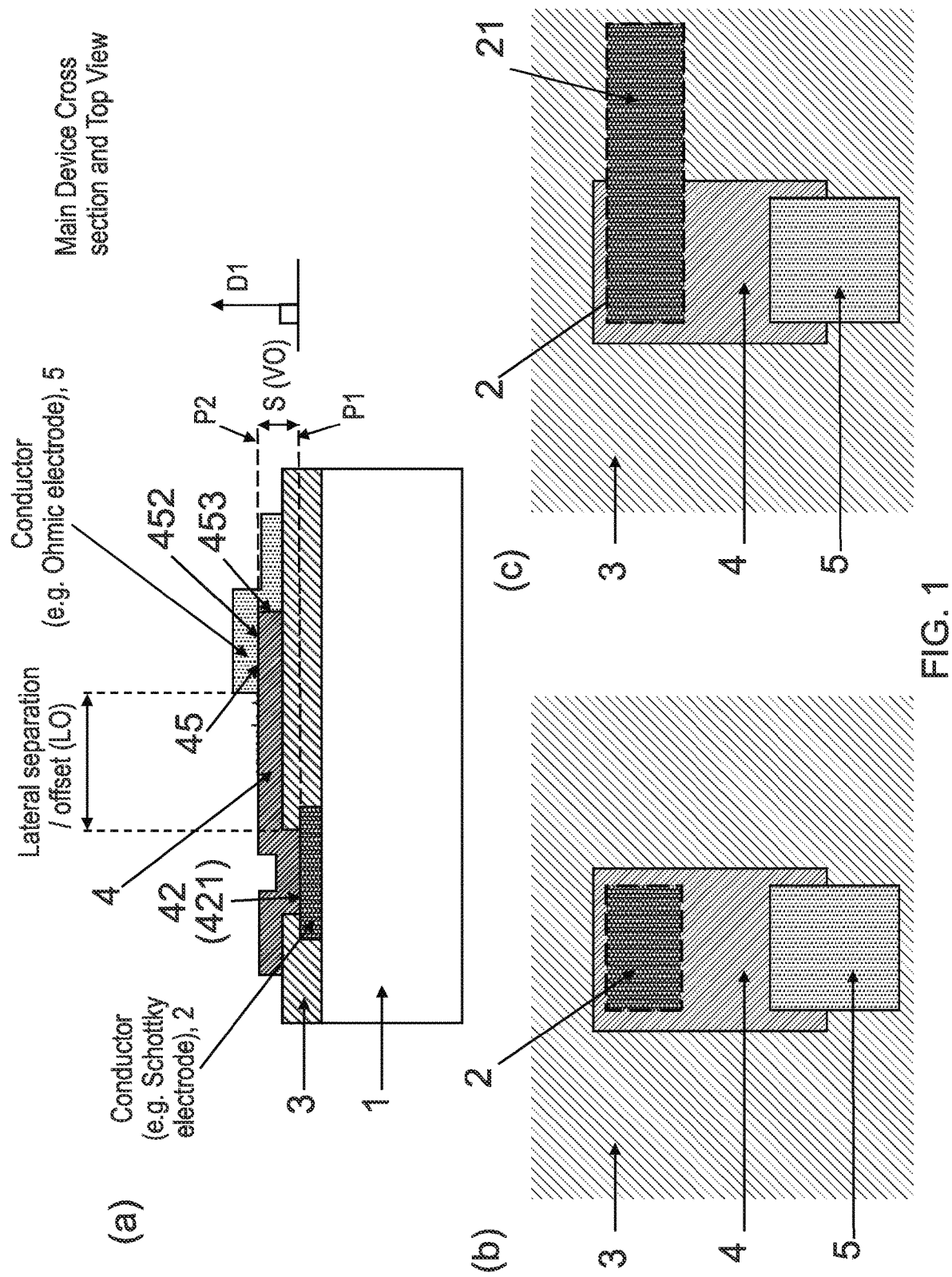
FIG. 1 illustrates a thin-film electronic device embodying the invention, and having been formed by a method embodying the invention.

Referring now to FIG. 1(a), this shows a side-view representation of a multi-layer device on an insulative substrate 1 which has been fabricated by a method according to the invention.

Layer 2 represents a patterned area of the first electrode. Layer 3 represents a patterned area of thin-film dielectric material. Layer 4 represents a patterned area of thin-film semiconductor material. Layer 5 represents a patterned area of the second electrode.

FIG. 1(b) shows a top-view of the device layers represented in FIG. 1(a).

FIG. 1(c) shows a top-view of device layers, including an example of an extended contact region 21 of first electrode 2. Such a contact region, extending laterally in the plane of electrode 2 beyond the overlaying semiconductor layer 4, may facilitate electrical connection of the first electrode 2 to other locations on substrate 1 or to locations elsewhere. During device manufacture the layer of dielectric material 3 may protect any extended contact regions of the first electrode 2 from processes that may subsequently be carried out on the second electrode 5, for example chemical or physical etching. Compared to purely vertical or lateral approaches, and to the device of FIG. 3 omitting the dielectric layer 3, here etch selectivity considerations of the two conductor layers do not impact the selection of materials that can be used for each of the two conductor layers.

FIGS. 1(d) and 1(e) show, respectively, a cross section view and a top view of device layers to illustrate a device having radial geometry. In this example the first electrode 2 is enclosed radially by second electrode 5, with semiconductor layer 4 connected between the two electrodes. Whilst a circular geometry is shown in FIG. 1(d) the device may take any geometry providing the desired offset between the first interface 42 of the semiconductor layer 4 with the first electrode 2, and the second interface 45 of the semiconductor layer 4 with the second electrode 5.

Referring again to FIG. 1, FIG. 1(a) is a schematic cross section of a Schottky diode embodying an aspect of the present invention as defined by claim 1. The Schottky diode comprises a first electrode 2, a second electrode 5, and a body 4 of semiconductive material connected to the first electrode at (or by) a first interface (which may also be referred to as a junction or contact) 42. The body 4 is also connected to the second electrode 5 at (or, equivalently, by) a second interface 452. In this example the first electrode is the Schottky electrode and the first interface 42 provides a Schottky (i.e. rectifying) contact. The second electrode 5 is a conductor providing an ohmic electrode, such that the second interface 45 provides an ohmic contact. However, it will be appreciated that in alternative embodiments the first electrode 2 may provide the ohmic electrode, and the second electrode 5 may provide the Schottky electrode. The person skilled in this field will be well aware of how, generally, to implement the Schottky and ohmic contacts, by choice of conductor materials relative to the semiconductive material and/or by appropriate processing of the portions of the conductive electrodes and/or semiconductive body at the interface regions. Whilst the term 'ohmic contact' has been used to describe one of the interface regions, it will be understood that this may in fact comprise any kind of junction that enables the Schottky diode to function, including a second Schottky junction or contact. The Schottky diode may function effectively if this 'ohmic contact' forms a barrier that is either sufficiently low, or that has a sufficiently low breakdown voltage, to not impede significantly the current flow through the Schottky diode when the Schottky diode is forward-biased. That is to say, the ohmic contact must allow current to flow through the Schottky diode when the first Schottky contact is conducting.

In this first embodiment, the first interface 42 consists entirely of a first planar region 421 lying in a first plane P1, and the first electrode 2 has a projection onto the first plane P1 in a first direction D1 normal to the first plane. The second interface 45 in this example comprises a second planar region 452 lying in a second plane P2, and also a further region 453 not lying in the second plane. Generally, this region 453 is the portion of the interface 45 between the second conductor 5 and the semiconductive body 4 at an edge of that body 4. In this example the second electrode 5 has a second projection onto the first plane P1 in the first direction D1, and that second projection lies completely outside the first projection, such that the second electrode 5 does not overlap the first electrode 2 to any extent. Thus, in this example the second electrode 5 is laterally separated or laterally offset from the underlying first electrode 2. In particular, the second planar portion 452 of the second interface 45 is laterally offset from the first planar portion or first planar region 421 (which forms the entirety of the first interface 42 in this example) by a distance LO in the figure.

In this example, the second electrode 5 is also vertically offset or separated from the first electrode 2 with the second planar region 452 being offset (i.e. separated or spaced) from the first planar region 421 in the first direction D1 by a distance S.

The device of FIG. 1(a) has been formed by a method in which the first electrode 2 has been formed on the substrate 1. Then, a layer of dielectric material 3 has been formed over the first electrode 2 and substrate 1, with a window through the dielectric layer leaving an upper portion of the first electrode 2 exposed. Then, the layer or body of semiconductive material 4 has been formed over the layer of dielectric material 3, such that the semiconductive material at least partially fills the window and the first interface 42 is formed inside the window between the semiconductive material 4 and the first electrode 2. The layer of semiconductive material 4 extends to cover part of an upper surface of the dielectric layer 3, and thus a portion of the semiconductive layer 4 extends laterally away from the window, and hence laterally away from the first interface 42. Then, the second electrode 5 has been formed on top of the body 4 of semiconductive material and dielectric layer 3. In this example, the second electrode 5 comprises a portion which is in direct contact with a portion of the upper surface of the dielectric layer 3, and a portion which overlaps an area of the upper surface of the body 4 of semiconductive material. That overlapping portion contacts the upper surface of the body 4 to form the second planar region 452 of the second interface 45. Advantageously, the lateral offset LO between the first and second planar regions 421, 452 can be accurately and finally controlled in the manufacturing technique, providing accurate and precise control over the Schottky diode characteristics.

In the embodiment of FIG. 1(a) it will be appreciated that the second plane P2 is parallel to the first plane P1, although in alternative embodiments the second plane P2 may not be parallel to P1.

It will also be appreciated that FIGS. 1(b) and 1(c) illustrate plan views of variations of the embodiments shown in FIG. 1(a), illustrating different arrangements of the non-overlapping (i.e. laterally and vertically offset) first and second electrodes 2, 5 which may be employed in certain embodiments of the invention.

Referring now to FIG. 1(d), this illustrates another embodiment closely related to that illustrated in FIG. 1(a). FIG. 1(e) is a plan view of the device shown in FIG. 1(d) (FIG. 1(d) illustrates a cross section). Like the embodiments of FIG. 1(a), the second electrode 5 is completely laterally offset from the first electrode 2, such that the projection of the second electrode 5 onto the plane P1 lies completely outside the projection of the first electrode 2 onto plane P1. In this example, the first electrode 2 is circular and the second electrode 5 is annular (i.e. it is in the form of a ring). Again, the second planar region 452 on the second interface 45 is laterally offset (in particular, it is radially offset) from the first planar region 421 by distance LO.

Still referring to FIG. 1(a), it will be appreciated that it illustrates a diode configuration with laterally and vertically separated electrodes, and the bottom electrode is shown as the Schottky contact as just one example.

In general, Operation frequency of a Schottky diode is governed by RC time constant of the diode (inversely proportional to frequency). The lateral diode configuration benefits from minimal overlap capacitance leading to an overall reduction in the parasitic capacitances compared to conventional vertical configuration. As for resistance, contact resistance can be reduced by increasing the conductor-semiconductor contact overlap while still maintaining appropriate separation between the two conductor contacts. However, there is a trade-off between the series resistance of the diode and the Schottky-Ohmic contact separation (series resistance increases with increased separation). This can be overcome by increasing the diode W/L ratio while still maintaining low parasitic capacitance and precise control over the channel length.

$$f_c = \frac{1}{2\pi RC}$$
$$R = \rho \frac{L}{A} = \rho \frac{L}{Wt},$$

Figure 2:
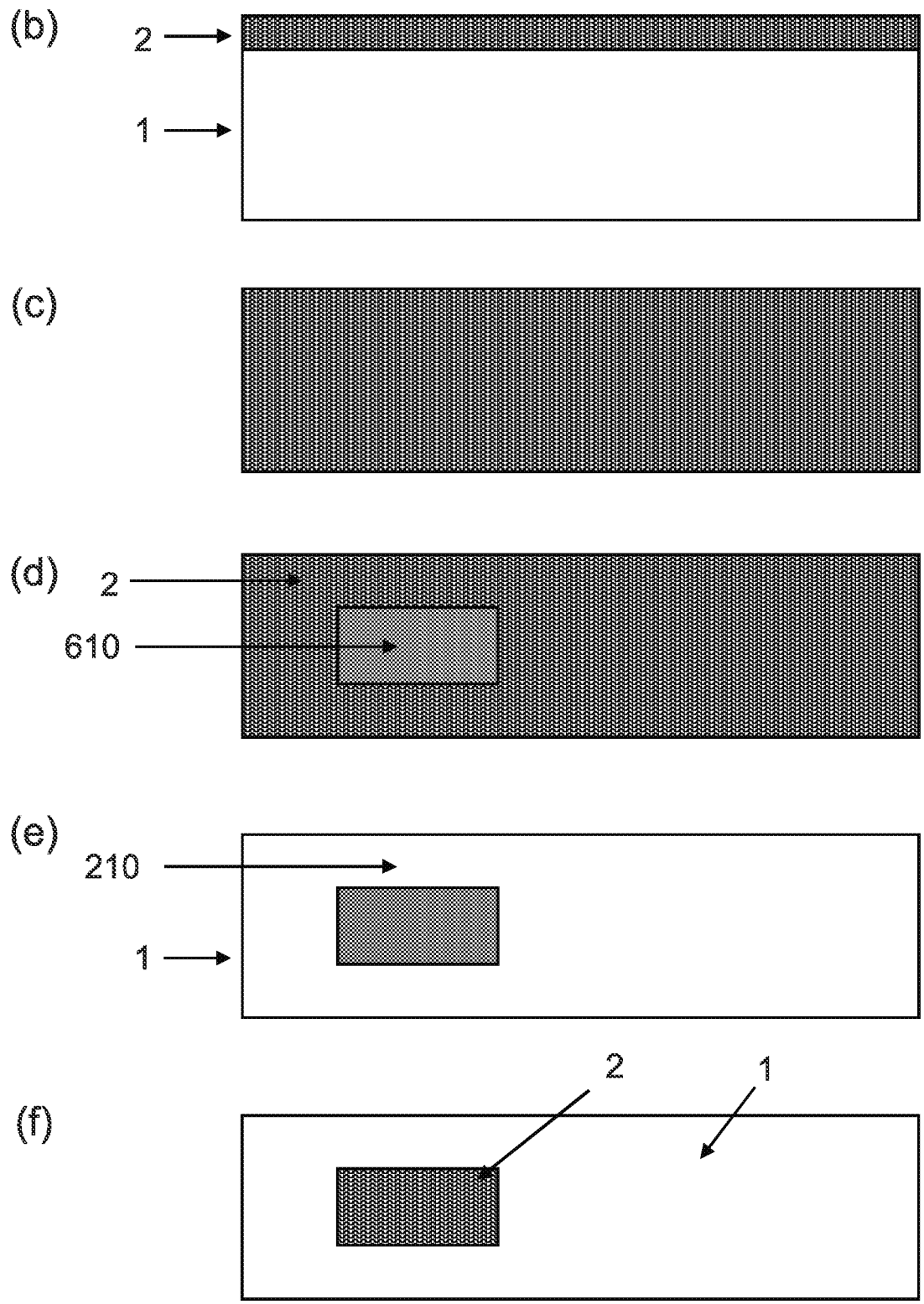
FIG. 2 illustrates a sequence of process steps in a method embodying the invention, and suitable for fabricating the device shown in FIG. 1.
Figure 2:
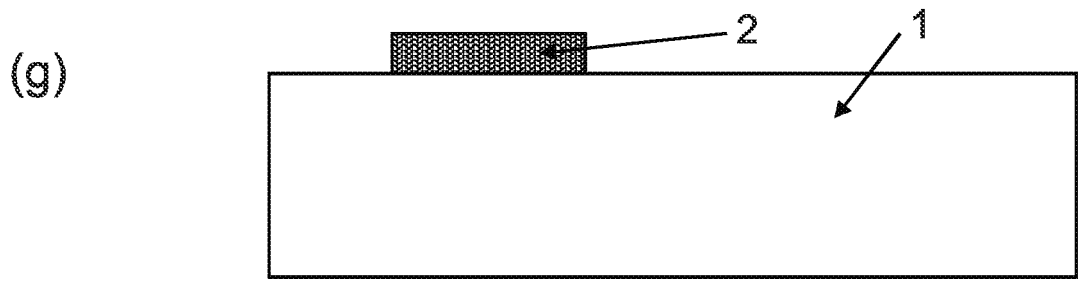
Figure 2:
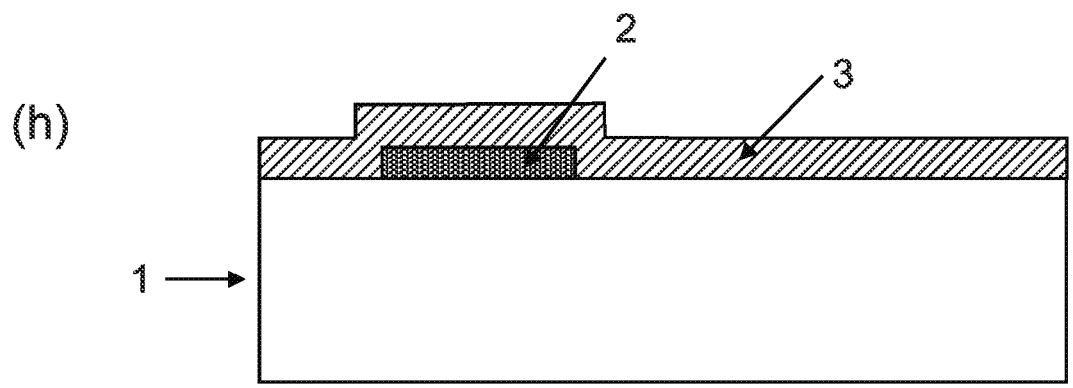
Figure 2:
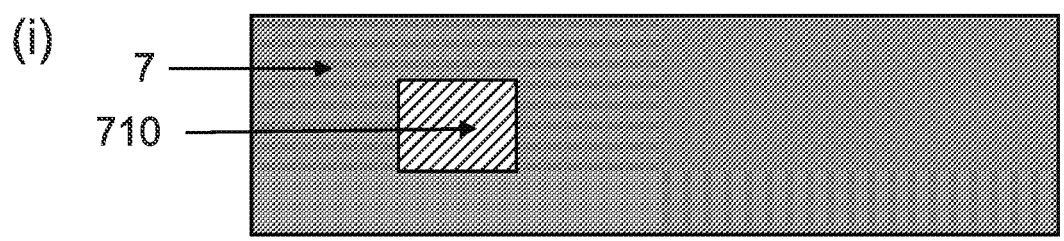
Figure 2:
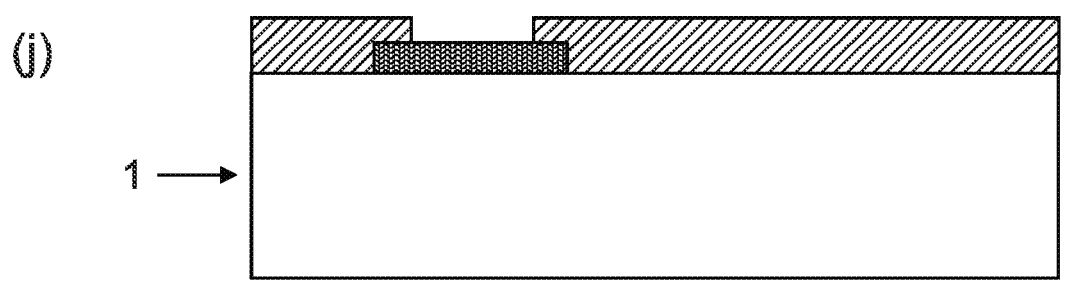
Figure 2:
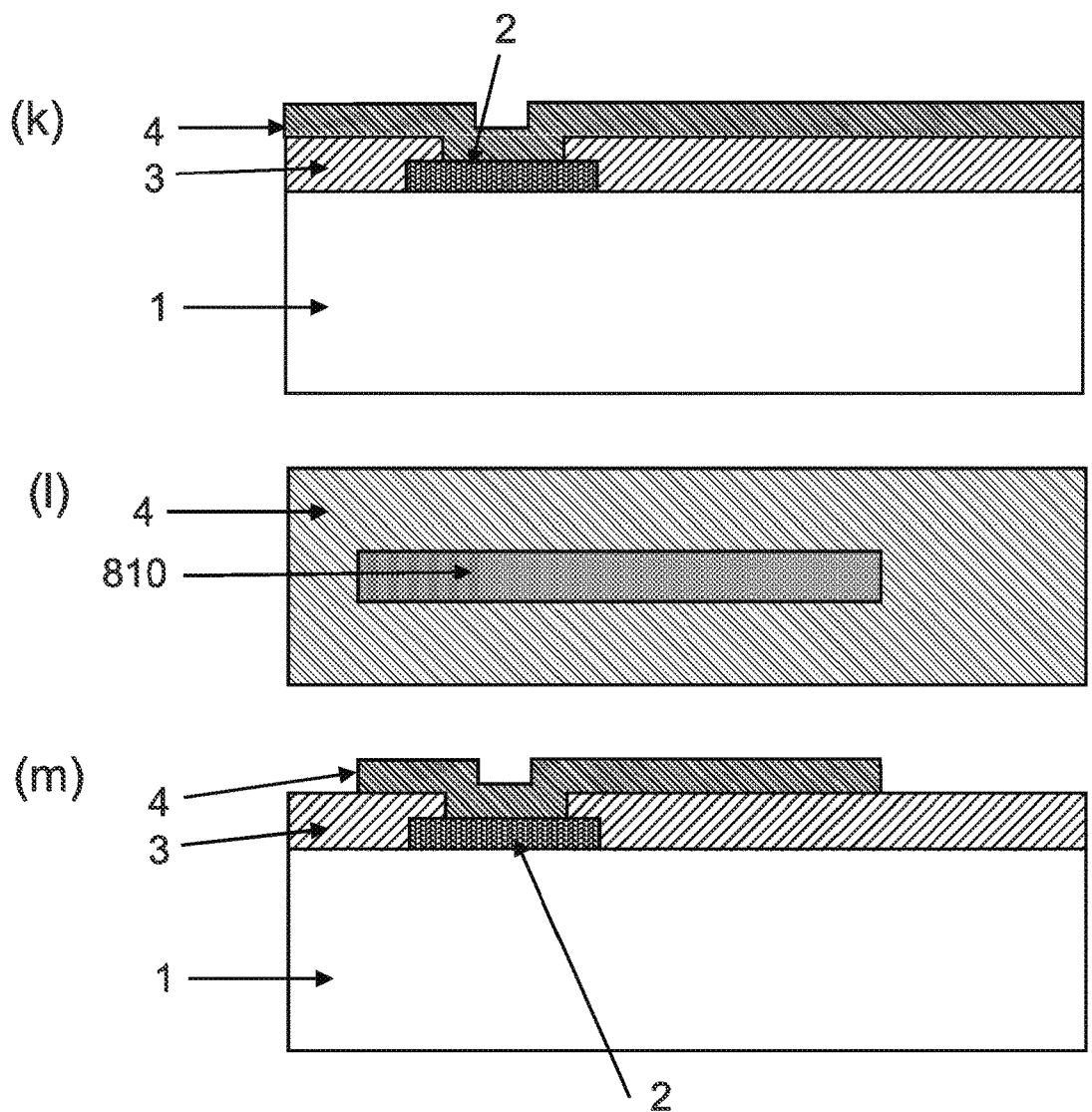
Figure 2:
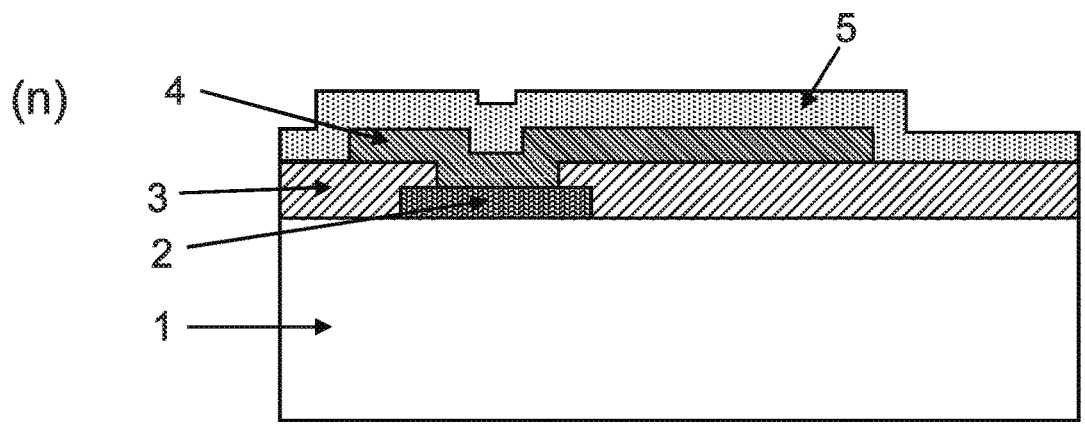
Figure 2:
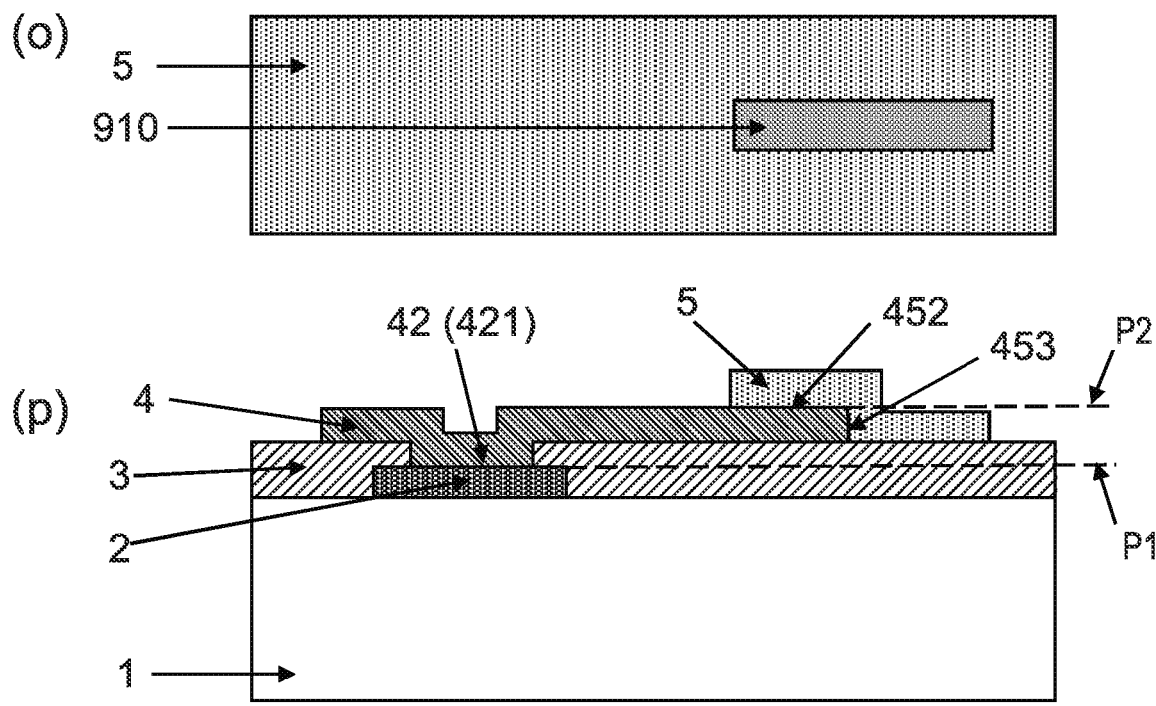

Referring now to FIG. 2, FIG. 2(a) shows an insulative substrate 1. FIGS. 2(b)-2(c) show side-view and top-view representations of substrate 1 completely covered by a layer of conducting material 2. Such complete coverage may be required in subtractive deposition techniques, e.g. conventional photolithography. An alternative route to producing the desired area of conductor layer is by using an additive, or selective deposition, technique such as one of the printing techniques noted later in this specification. FIG. 2(d) shows a further stage where a layer of resist material 6 has been deposited to selectively cover 610 a portion of conducting layer 2, for example photoresist which has been patterned by photolithography or a polymer that has been patterned by laser or mechanical cutting, by imprinting or embossing, followed by oxygen plasma ashing. Alternatively, in certain embodiments, the selective covering of a portion of the conductor layer with resist material is achieved by printing resist material over the desired area. In certain embodiments an area of the conductor layer is selectively covered by first covering the entire conductor layer, and then selectively removing resist material. A wide variety of techniques may be used to form the at least one layer of resist material, and a variety of resist materials may be employed in different embodiments of the invention. These methods of forming the at least one layer of resist material include coating (spin, dip, blade, bar, spray, slot-die) or extrusion. Suitable resist materials include poly hydroxybutyrate, polymethyl methacrylate, polyvinylalcohol, polyvinyl acetate, polyvinyl pyrrolidone, polyvinylphenol, polyvinyl chloride, polystyrene, polyamide (e.g. Nylon), poly(hydroxyether), polyurethane, polycarbonate, polysulfone, polyarylate, acrylonitrile butadiene styrene, polyimide, benzocyclobutene (BCB), photoresist, 1-Methoxy-2-propyl acetate (SU-8), polyhydroxybenzyl silsesquioxane (HSQ), fluorinated polymers e.g. PTFE, UV curable liquid resin (such as those described in U.S. Pat. No. 6,284,072), silicone, siloxane, parylene. Commercial imprint resists are available through companies such as Microchem/Microresist, Shipley and Nanolithosolution Inc.

In alternative embodiments, the desired area or portion of the conductor layer is covered by selectively depositing, printing, or otherwise covering that area with resist material. FIG. 2(e) shows a further stage where the exposed areas 210 of conducting layer 2 have been removed, for example by etching (wet and/or dry etching techniques may be used), ablation, and/or milling. FIG. 2(f) shows a subsequent stage where resist material 6 covering area 610 of conducting layer 2 has been removed, for example by using photoresist developer, ablation, oxygen plasma etc. FIG. 2(g) shows a side-view of layer 2 after resist material 6 has been removed.

FIG. 2(h) shows a further stage where a dielectric layer 3 has been deposited onto layer 2. FIG. 2(i) shows resist layer 7 having been deposited onto dielectric layer 3 and patterned to form a window 710 through the resist and exposing an area of the dielectric layer 3 beneath. FIG. 2(j) shows a further stage where the area of dielectric layer 3 exposed through the window 710 in the resist layer 7 has been removed, for example by etching (wet and/or dry etching techniques may be used), ablation, and/or milling, and a subsequent stage where resist material 7 has been removed, for example by using photoresist developer, ablation, oxygen plasma etc.

FIG. 2(k) shows of a further stage where a semiconductor layer 4 been deposited onto dielectric layer 3. FIG. 2(l) shows a further stage where a layer of resist material 8 has been deposited to selectively cover 810 a portion of semiconductor layer 4, in a manner described above in reference to FIG. 2(d). Exposed areas of semiconductor layer 4 are then removed, for example by etching (wet and/or dry etching techniques may be used), ablation, and/or milling. In a subsequent stage, resist material 8 is removed, for example by using photoresist developer, ablation, oxygen plasma etc. FIG. 2(m) shows a side-view of semiconductor layer 4 after resist material 8 has been removed.

FIG. 2(n) shows a further stage where a second electrode layer 5 been deposited onto semiconductor layer 4. FIG. 2(o) shows a further stage where a layer of resist material 9 has been deposited to selectively cover 910 a portion of second electrode layer 5, for example photoresist which has been patterned or a polymer that has been patterned by laser or mechanical cutting, by imprinting or embossing, followed by oxygen plasma ashing. Alternatively, in certain embodiments, the selective covering of a portion of the conductor layer with resist material is achieved by printing resist material over the desired area. Thus, in certain embodiments an area of the conductor layer is selectively covered by first covering the entire conductor layer, and then selectively removing resist material. In alternative embodiments, the desired area or portion of the conductor layer is covered by selectively depositing, printing, or otherwise covering that area with resist material. Exposed areas of second electrode layer 5 are then removed, for example by etching (wet and/or dry etching techniques may be used), ablation, and/or milling. In a subsequent stage, resist material 9 is removed, for example by using photoresist developer, ablation, oxygen plasma etc. FIG. 2(p) shows a side-view of second electrode layer 5 after resist material 9 has been removed. Thus, FIG. 2(p) shows a Schottky diode having the same general structure as that shown in FIG. 1(a) and described above.

Figure 3:
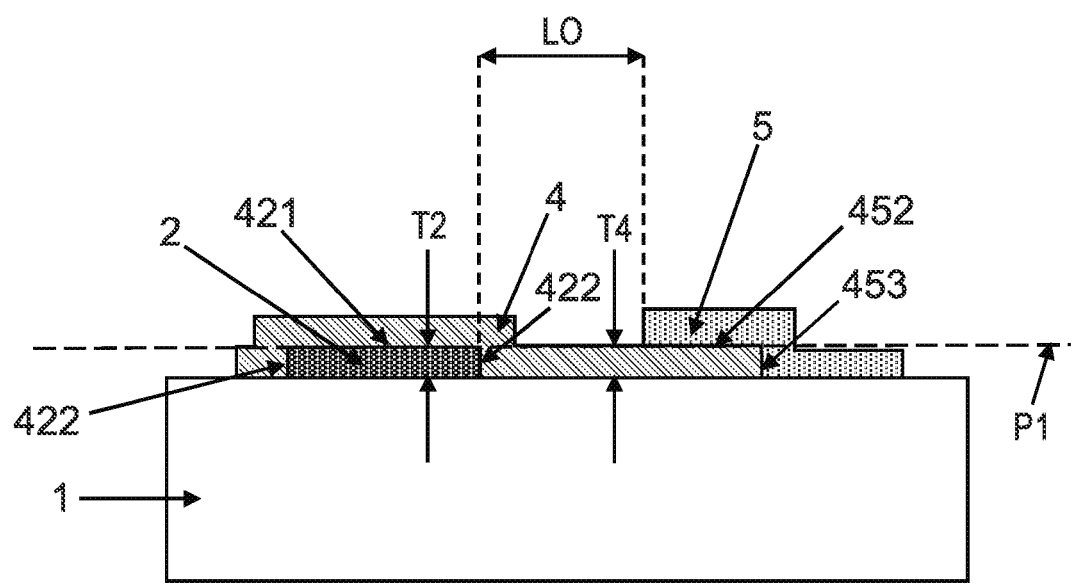
FIG. 3 illustrates another electronic device embodying the invention.

Referring now to FIG. 3 this shows a device formed by a method embodying the invention where there is no dielectric layer 3 in between first electrode layer 2 and semiconductor layer 4. This method omits steps 2(h), 2(i) and 2(j) from the method described above. As such this device is of a simpler structure, and requires fewer manufacturing process steps, than the device of FIG. 1. These advantages may be considered against the additional freedom of choice in electrode materials enabled by the presence of dielectric layer 3, described above.

Referring again to FIG. 3, this shows a device (a Schottky diode) in certain respects similar to the embodiment illustrated in FIG. 1(a), but not comprising a dielectric layer 3. The device of FIG. 3 embodies the aspect defined by claim 20. In the embodiment of FIG. 3, the first electrode 2 has been formed on a surface of the substrate 1 and then the body of semiconductive material 4 has been formed over the first electrode 2 and substrate 1 so as to completely cover the first electrode 2 and a portion of the upper surface of the substrate 1 extending laterally from the first electrode 2. A first interface 42 has thus been formed between the body 4 of semiconductive material and the first electrode 2, that interface comprising a first planar portion 421 (in this example on top of the first electrode 2), and side or edge interface portions 422 (generally at the edges of the first electrode 2). Then, the second electrode 5 has been formed on top of the semiconductor body 4 and substrate 1 so as to cover a portion of that body 4 and a portion of the substrate 1 upper surface. By forming the second electrode 5 in this way, a second interface 45 has been formed between the second electrode 5 and the semiconductor body 4, that second interface comprising a second planar portion 452 and a further edge portion 453. In this example the thickness T4 of the layer of semiconductive material 4 is substantially the same as the thickness T2 of the first electrode 2, and hence the first planar region 421 and the second planar region 452 lie in the same plane, that is plane P1. In other examples the thickness of the layer of semiconductive material 4 and the thickness of the layer of the first electrode 2 are not the same, and the first planar region 421 and the second planar region 452 do not lie in the same plane. Advantageously, a lateral offset LO has been provided between the first and second planar regions 421 and 452, and with the general manufacturing techniques described in the specification, accurate and precise control of that separation LO may be achieved, thereby enabling accurate control of the Schottky diode characteristics.

Figure 4:
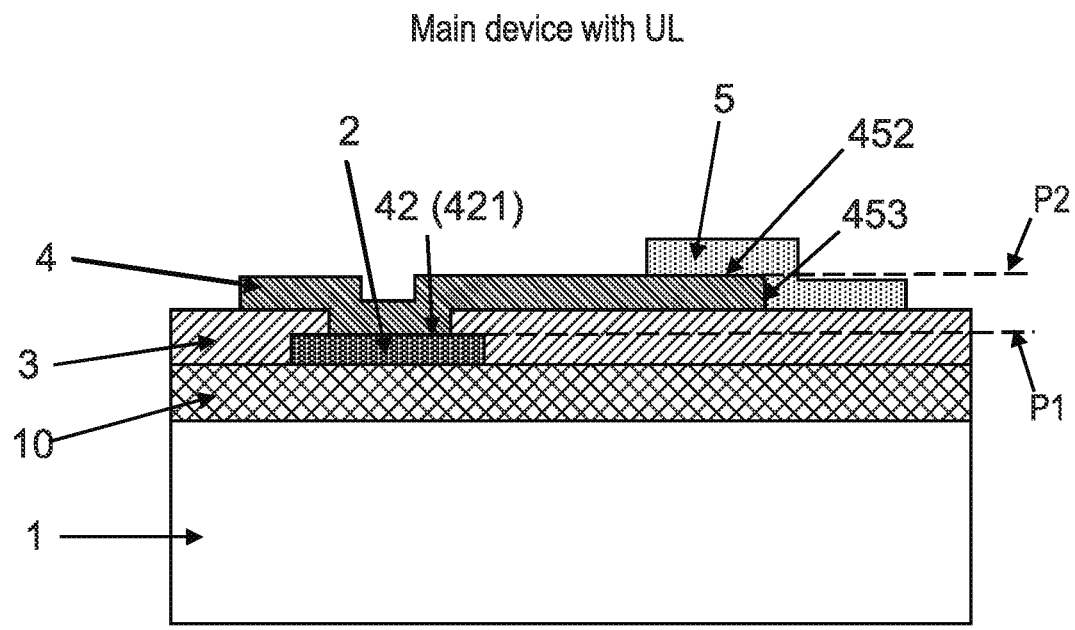
FIG. 4 illustrates another electronic device embodying the invention.

Referring now to FIG. 4 this illustrates a device formed by a method embodying the invention. There is provided an insulative substrate 1 completely covered by a layer of dielectric material 10. Such a layer of dielectric material underlying the other device layers may provide a passivation or protection function for the device stack from the substrate 1, potentially increasing the choice of materials that may be used for substrate 1 without adversely affecting device performance.

Referring again to FIG. 4, it will be appreciated that FIG. 4 illustrates another embodiment in which the second electrode 5 is both vertically and laterally offset from the first electrode 2, such that a projection of the second electrode 5 onto the plane P1 of the first interface 42 lies completely outside a projection of the first electrode 2 onto plane P1. Also, the projection of the second planar region 452 onto plane P1 lies completely outside the projection of the first planar region 421 onto P1.

Figure 5:
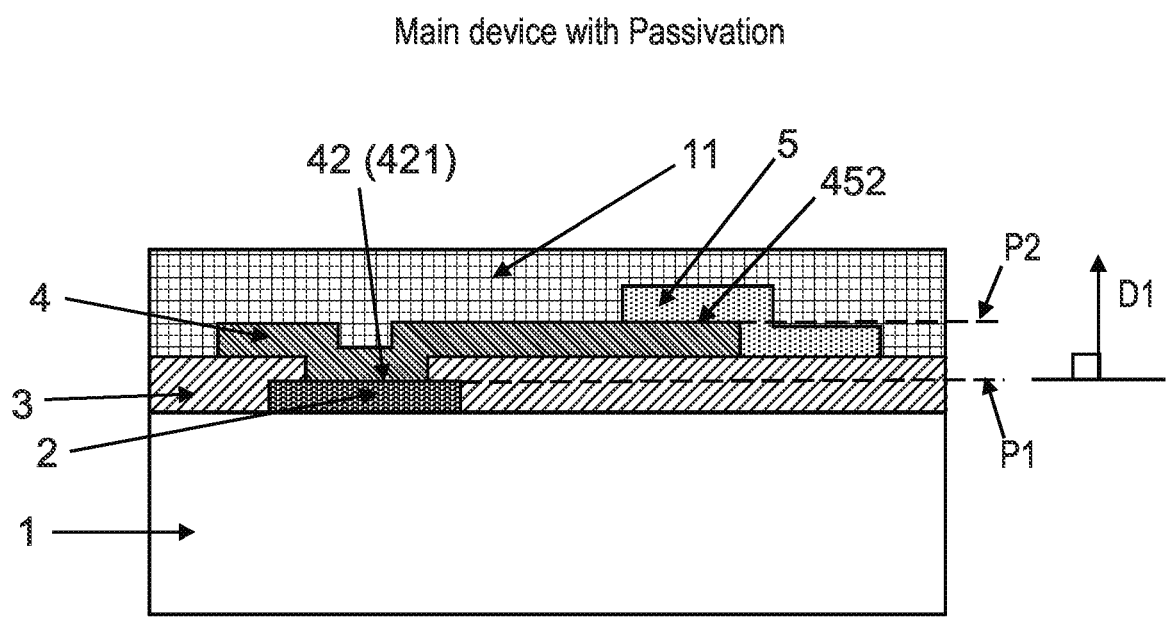
FIG. 5 illustrates another electronic device embodying the invention.

Referring now to FIG. 5 this shows a device formed by another method embodying the invention where an additional insulative layer 11 has been provided on top of layers 3, 4 and 5. Insulative layer 11 gives the effects of improving the interface of the semiconductor layer and/or passivating the device, so as to minimise or eliminate environmental effects.

Figure 6A:
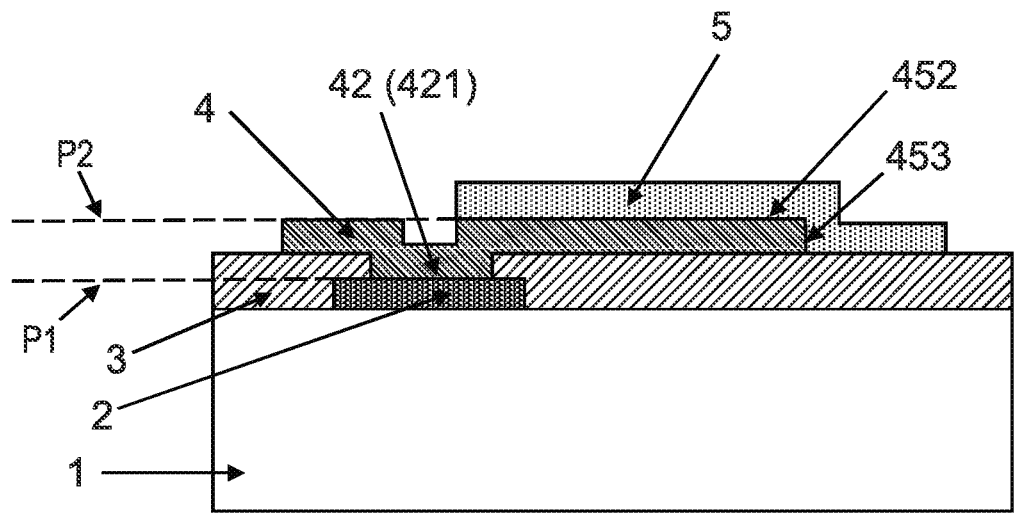
FIG. 6 illustrates another electronic device embodying the invention.
Figure 6B:
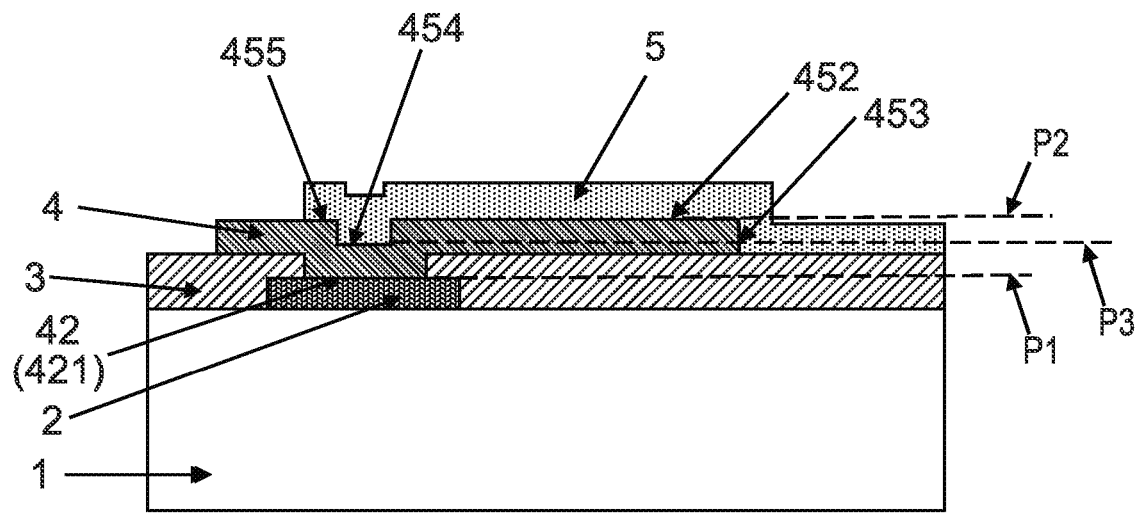

Referring now to FIG. 6(a) this illustrates a device formed by a method embodying the invention. There is provided a device such that the second interface 45 is offset laterally from the first interface 42 such that a projection of the second interface onto the first plane overlaps the first interface partially. FIG. 6(b) this illustrates a device formed by a method embodying the invention. There is provided a device such that a projection of the second interface onto the first plane overlaps the first interface completely. The lateral interface overlaps in the devices illustrated in FIGS. 6(a) and 6(b) allow further control of the resistance and capacitance of the devices, which in turn affect their current vs. voltage characteristics, operation frequency, etc.

Referring again to FIG. 6(a), it will be appreciated that this embodiment is one in which a projection of the second electrode 5 onto plane P1 partially overlaps the projection of first electrode 2 onto plane P1, and indeed a projection of the second planar region 452 (in the first direction onto plane P1) partially overlap the first planar region 421.

Referring again to FIG. 6(b), it will be appreciated that in this particular embodiment the projection of the second electrode 5 onto plane P1 partially overlaps the projection of the first electrode 2 onto P1, but fully overlaps the first planar region 421. In this example, the second interface comprises an edge portion 453, a second planar region 452, a third planar region 454, and a fourth planar region 455. The planar regions 452, 454 and 455 together fully overlap the first planar region 421. In this example, the second planar region 452 and the fourth planar region 455 lie in plane P2, which is parallel to P1, and the third planar region 454 lies in a third plane P3, which is also parallel to P1.

Figure 7:
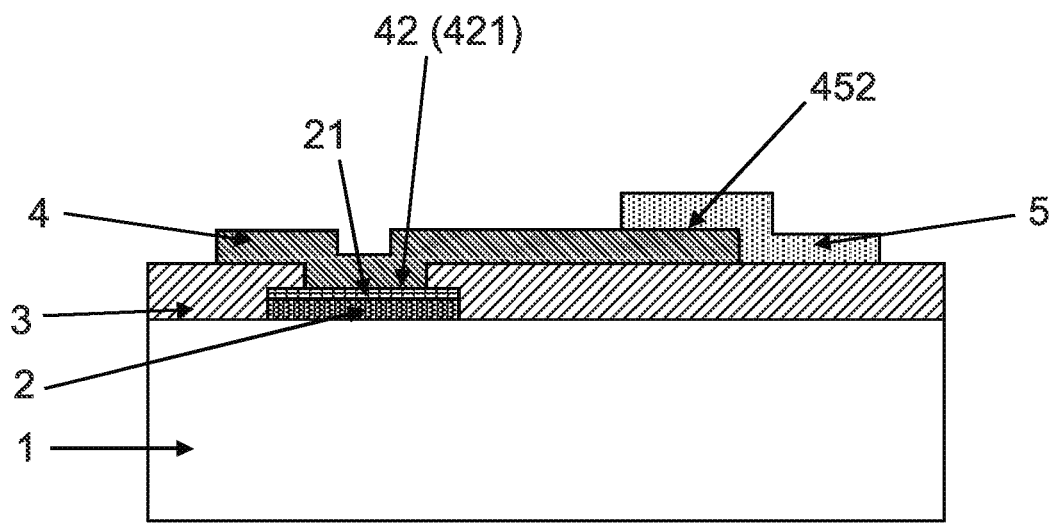
FIG. 7 illustrates another electronic device embodying the invention.

Referring now to FIG. 7 this illustrates a device formed by a method embodying the invention. There is provided a device where (upper) surface 21 of first electrode 2 has been modified (for example by implantation, plasma treatment, self-assembled monolayers (SAM), atomic layer deposition (ALD), ozone UV, laser exposure and/or thermal annealing). Such surface engineering of the first electrode 2 may modify the electrode's work-function and/or introduce a Schottky barrier. A surface modification process that is selective only to electrode 1 could be selected.

For example, certain embodiments comprise a Schottky barrier formed between a conducting electrode (e.g. layer) of titanium and a semiconducting body (e.g. layer) of oxide semiconductor, such as IGZO or any other oxide semiconductor mentioned elsewhere in this specification. In such embodiments, a surface (e.g. an upper surface), or a portion of that surface, of the titanium electrode (e.g. layer) may be modified by forming upon it a layer of titanium oxide(s) (e.g. TiO2 and/or TiO) prior to deposition of the semiconducting body (e.g. layer). In more detail, the "layer of titanium oxide(s)" may comprise, include, or consist of a single titanium oxide or suboxide composition, or a combination of some or all of titanium oxide (TiO), titanium trioxide (Ti2O3), titanium dioxide (TiO2), and one or more titanium suboxides (TiOx, where x is between 1 and 2 or between 0 and 1, for example 0.7 and 1.3). In other words, the "layer of titanium oxide(s)", or "titanium oxide layer" may be a layer comprising, or consisting of, at least one titanium oxide or suboxide. Formation of the titanium oxide layer may be controlled by temperature, atmospheric composition and/or pressure, and/or application of a plasma or other stimulus, as is well known in the art. Thus, in certain methods embodying the invention, a conducting electrode (e.g. the Schottky anode) may be formed by first depositing, or otherwise forming, a titanium body (e.g. layer) on a substrate or other supporting body or structure. Then, in a surface processing step (e.g. an annealing step) a titanium oxide layer is formed on a surface of the titanium body. A body (e.g. layer) of semiconductive material (e.g. an oxide semiconductor, such as IGZO) is then formed, at least partially overlapping the titanium oxide layer such that an interface between the semiconductive material and the titanium oxide layer provides a Schottky barrier (contact). Thus, certain embodiments comprise a Schottky anode comprising a body of titanium having a titanium oxide layer formed on a surface of that body. In the diode, the titanium oxide layer interfaces with the semiconductor material to form the Schottky barrier.

Figure 8A:
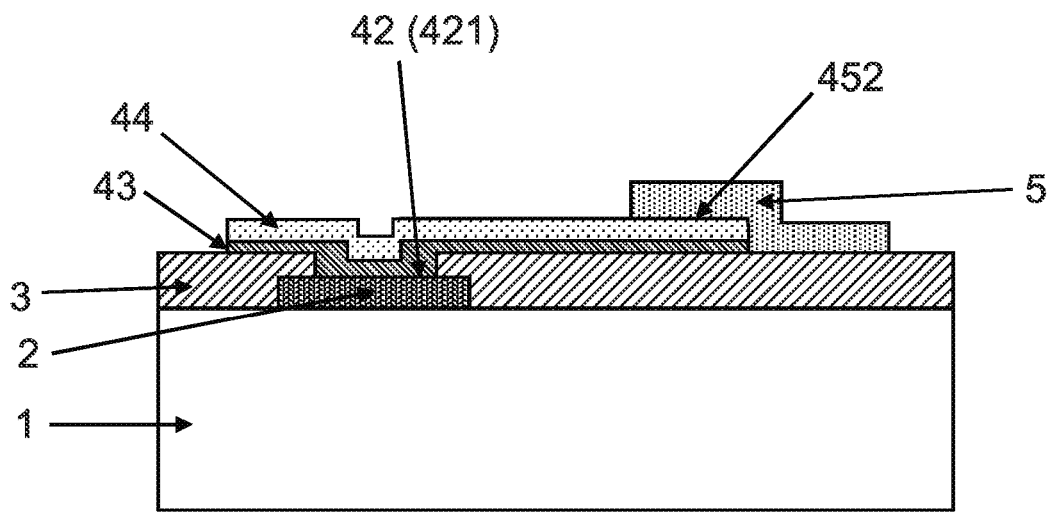
FIG. 8 illustrates another electronic device embodying the invention.

Referring now to FIG. 8(a) this illustrates a device formed by a method embodying the invention. There is provided a device such that the (upper) surface of the semiconductor layer 44 has been modified (for example by doping, implantation, plasma treatment, self-assembled monolayers, atomic layer deposition, ozone UV, laser exposure and/or thermal annealing) or is formed from a different semiconductor material to the material forming the lower part of the semiconductor layer 43. The upper surface of semiconductor layer 44 may be doped by a donor material deposited upon that surface, as is known by the skilled person. For example, a donor material may be deposited upon semiconductor layer 4 prior to or following deposition of second electrode 5. FIG. 8(b) this illustrates a device formed by a method embodying the invention. There is provided a device such that part of the (upper) surface of the semiconductor layer 46 in contact with the second electrode 5 has been modified (for example by doping, implantation, plasma treatment, self-assembled monolayers, atomic layer deposition, ozone UV, laser exposure and/or thermal annealing) or is formed from a different semiconductor material to the material forming the remaining part of the semiconductor layer 45. Part of the upper surface of semiconductor layer 46 may be doped by a donor material deposited upon that surface, similarly to the case described above relating to FIG. 8(a). The surface modifications described in reference to FIGS. 8(a) and 8(b) allow control of a Schottky barrier height, and in turn of device characteristics, by adjusting the Fermi level of the semiconductor.

Figure 9B:
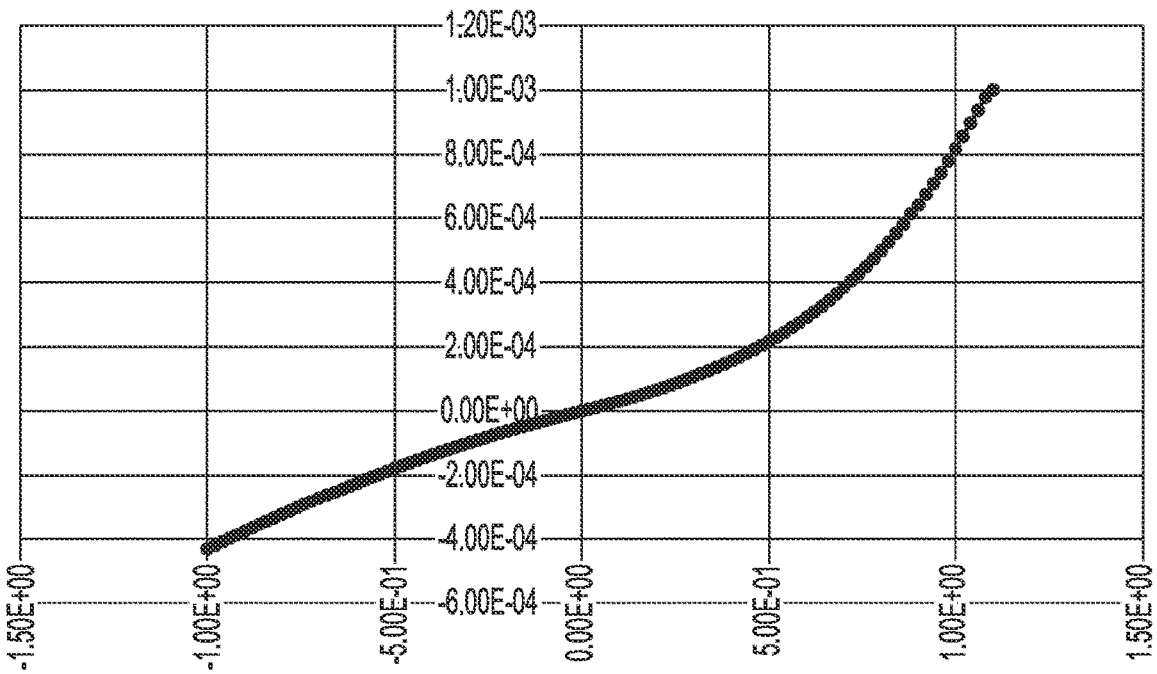
FIG. 9 illustrates typical current voltage characteristics of an electronic device embodying the invention fabricated following sequence of process steps shown in FIG. 2.
Figure 10A:
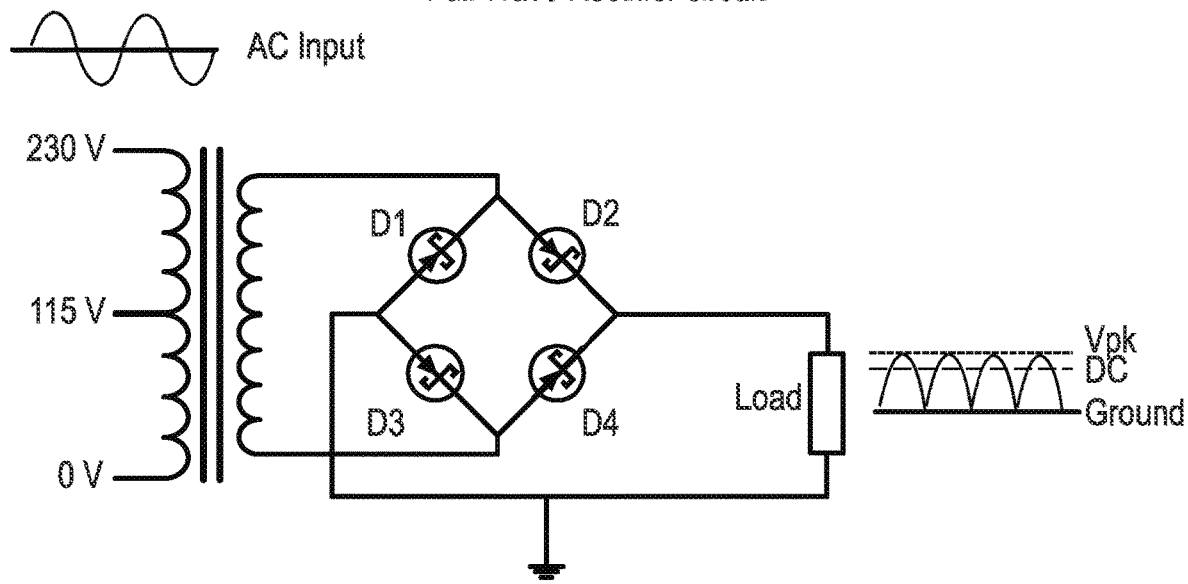
FIG. 10 illustrates circuit schematics embodying the invention.
Figure 10B:
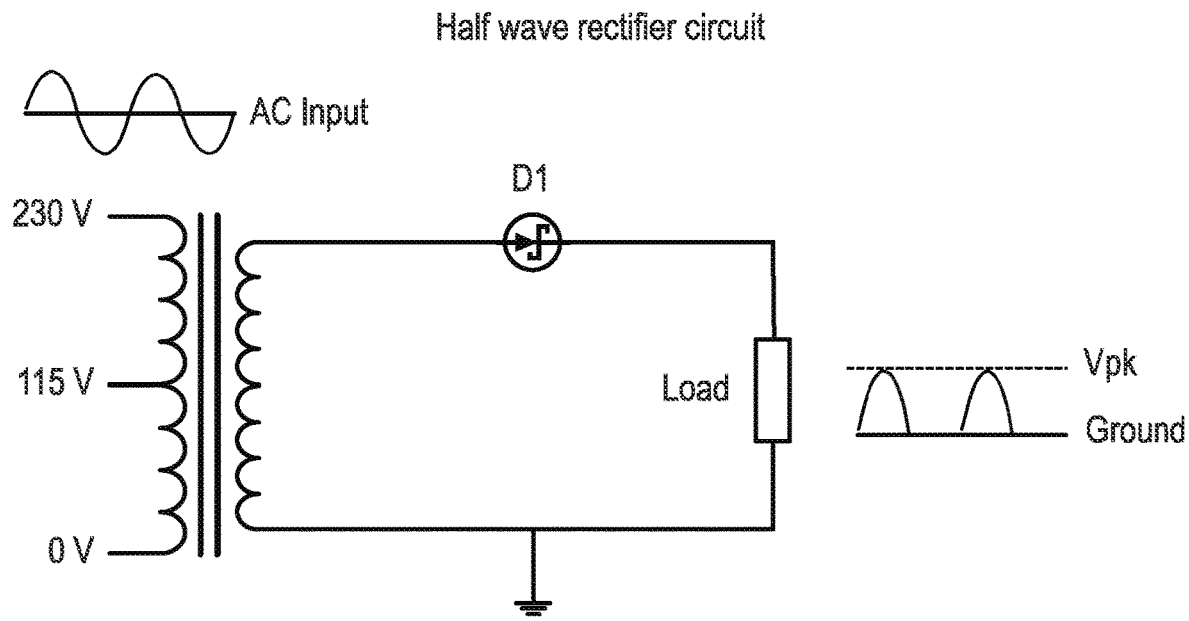
Figure 10C:
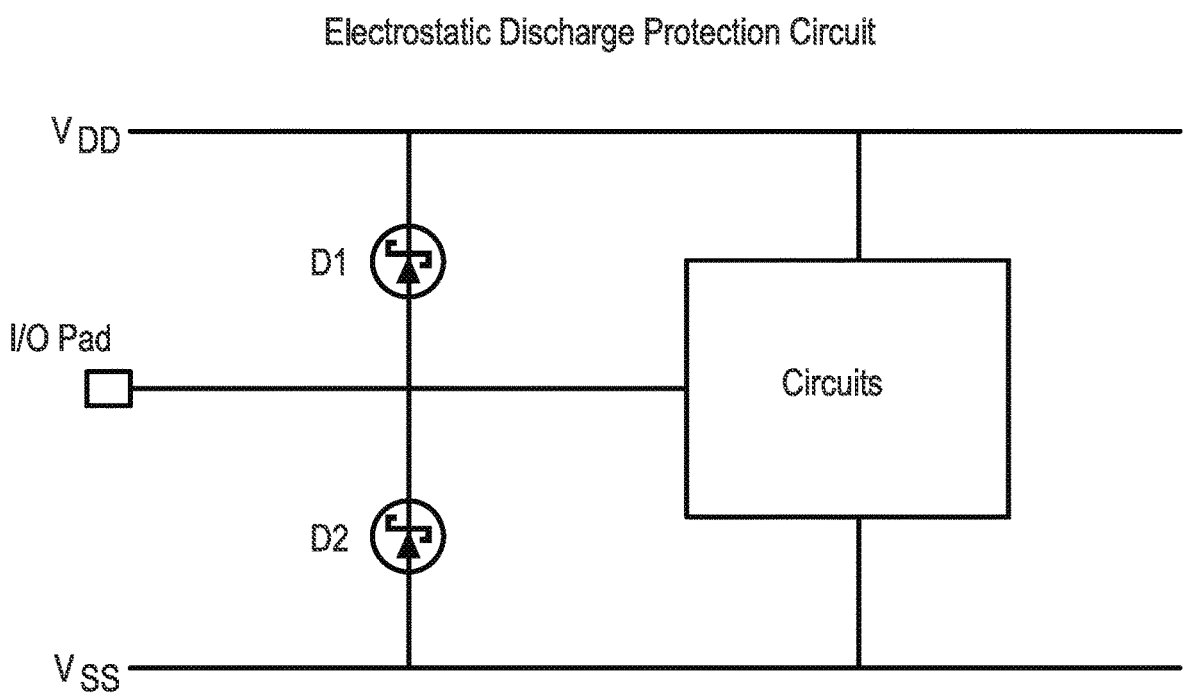
Figure 10D:
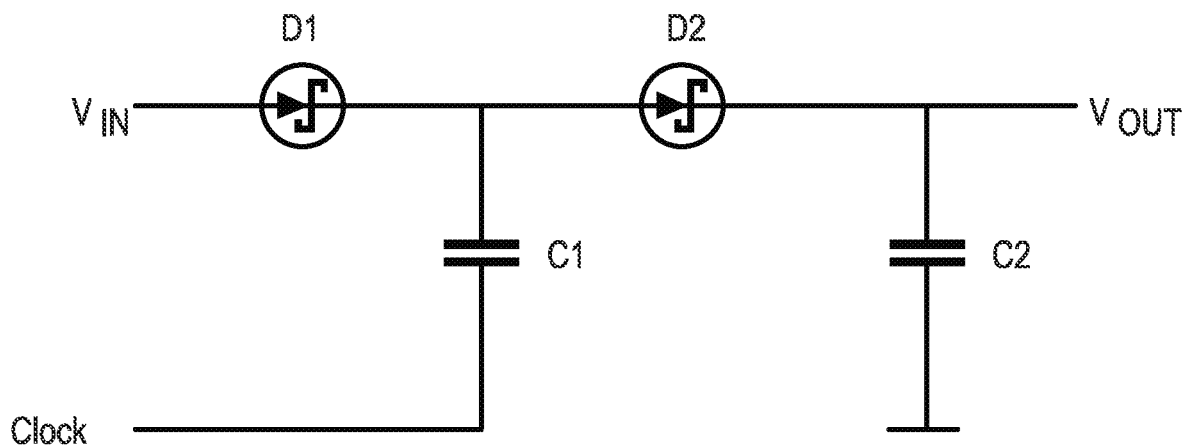

FIG. 9 illustrates typical current voltage characteristics of an electronic device embodying the invention formed by a method embodying the invention following sequence of process steps shown in FIG. 2. FIG. 9(a) shows current vs. voltage characteristics of a lateral Schottky diode, wherein the second interface is offset from the first interface such that a projection of the second interface onto the first plane does not overlap the first interface, this configuration benefits from high reverse breakdown voltage and low reverse leakage current (0.5 uA at 30V reverse bias). FIG. 9(b) shows current vs. voltage characteristics of a lateral Schottky diode, wherein the second interface is offset from the first interface such that a projection of the second interface onto the first plane partially overlaps the first interface, this configuration benefits from high forward current (1 mA at 1V forward bias). FIG. 9 illustrates that lateral structures with different interface offsets may provide multiple devices having different characteristics on the same substrate, in a way that minimises the number of process steps required.

FIG. 10 illustrates typical circuit configurations utilizing lateral Schottky diodes embodying the invention, these can be configured to form a rectifier to convert alternating current (full wave (a) or half wave (b)) into direct current, configured as Electrostatic Discharge (ESD) protection elements preventing sudden flow of current due to discharge of static electrical charge (c), or configured as voltage regulators to maintain a constant voltage level (d). Referring now to FIG. 10(a), this illustrates a typical full wave rectifier circuit schematic embodying the invention. Referring now to FIG. 10(b), this illustrates a typical half wave rectifier circuit schematic embodying the invention. Referring now to FIG. 10(c), this illustrates a typical ESD protection circuit schematic embodying the invention. Referring now to FIG. 10(d), this illustrates a typical voltage multiplier circuit schematic embodying the invention. Lateral Schottky diodes embodying the invention may be combined in one or more of these and/or other circuit configurations in the same integrated circuit, without adding to the number of process steps required for their manufacture.

Figure 11:
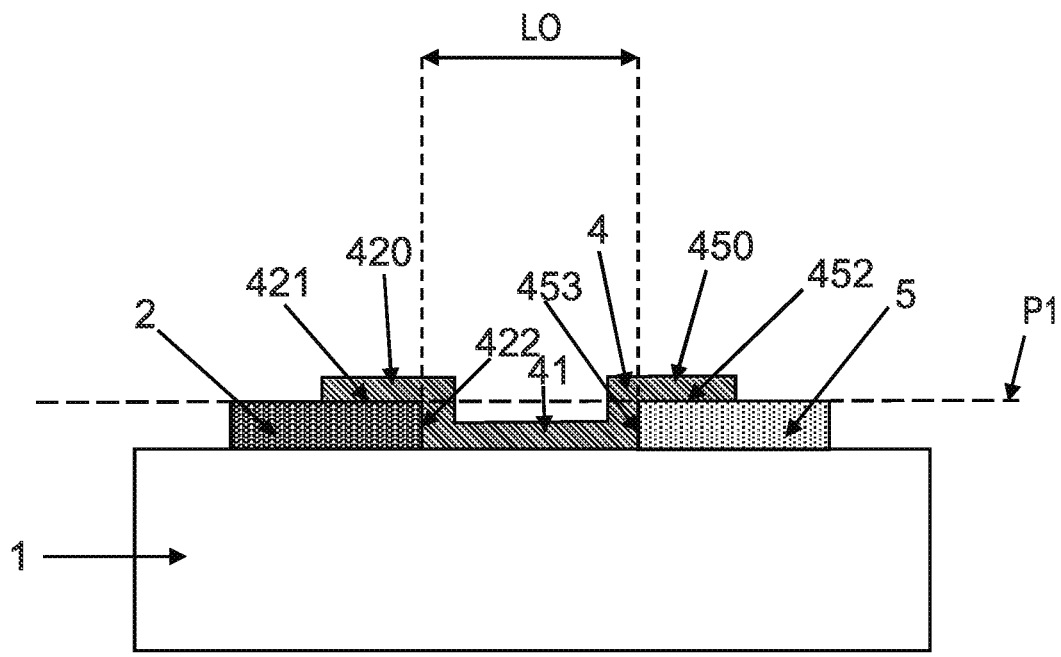
FIG. 11 illustrates a Schottky diode embodying an aspect of the present invention.

Referring now to FIG. 11, this illustrates an embodiment of another aspect of the present invention, that aspect generally as defined by claim 31. The diode comprises a first electrode 2 and a second electrode 5, each formed on a surface of a substrate 1. In this example those electrodes are formed on a common, upper surface of the substrate 1. Then, a body of semiconductor material 4 has been formed over the underlying electrode and substrate structure, such that the body 4 comprises a central portion covering a portion of the upper surface of the substrate 1 between the electrodes, and further portions 420, 450 of the body 4 overlap upper portions of the first electrode 2 and second electrode 5 respectively. A first interface 42 is thus formed between the semiconductor material 4 and first electrode 2, that first interface comprising a first planar portion 421 and an edge portion 422. Similarly, a second interface 45 is formed between the semiconductor 4 and second electrode 5, that second interface comprising a second planar region 452 and a further edge portion 453. In this example, the thicknesses of the first and second electrodes are substantially the same, and hence the first and second planar regions 421, 452 lie substantially in the same plane, P1. The projections of the first and second electrodes onto plane P1 in a direction normal to that plane do not overlap, and those projections are laterally offset by the distance LO. In this example, that lateral offset LO also corresponds to the lateral separation between the first planar region 421 and the second planar region 452 of the first and second interfaces respectively.

It will be appreciated that the embodiment of FIG. 11 is a structure without a dielectric layer. The semiconductive material may be any semiconductive material disclosed in this specification or apparent to the skilled person. It will also be appreciated that, in order to manufacture the structure of FIG. 11, the materials chosen for first electrode 2 and second electrode 5 should be selected to have suitable etch selectivity. Alternatively, greater freedom of choice in materials for dielectric layer 3, semiconductor layer 4, electrode 2 and electrode 5 may be provided by methods in which one or more of the electrodes is not patterned by etching, but rather by lift-off patterning or printing, for example.

Figure 12:
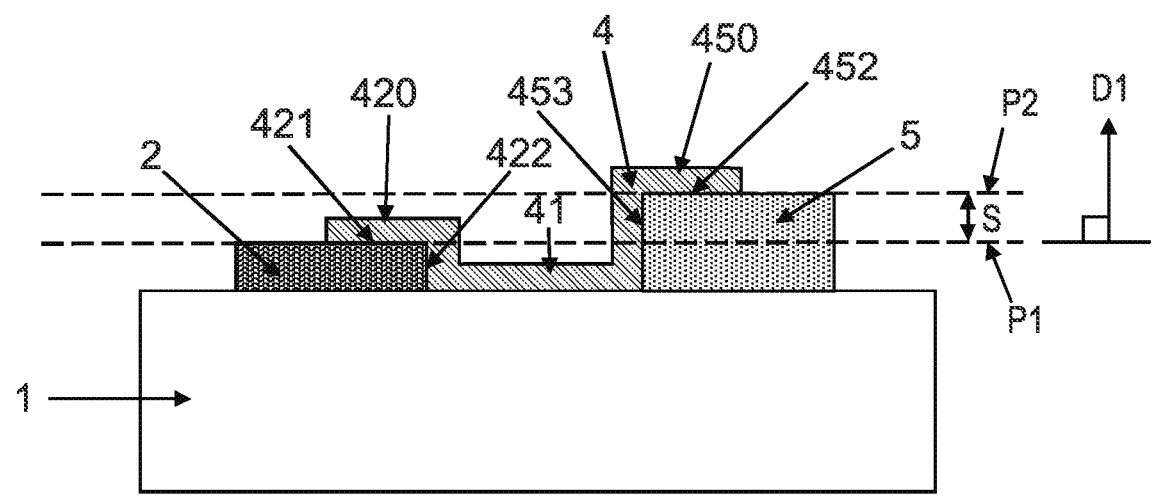
FIG. 12 illustrates another Schottky diode embodying an aspect of the present invention.

Referring now to FIG. 12, this illustrates an embodiment similar to that shown in FIG. 11, but here the first and second electrodes 2, 5 have different thicknesses. Thus, the first planar region 421 and second planar region 452 do not lie in the same plane; instead they lie in the first plane P1 and second plane P2 respectively, those planes separated by a distance S.

Figure 13:
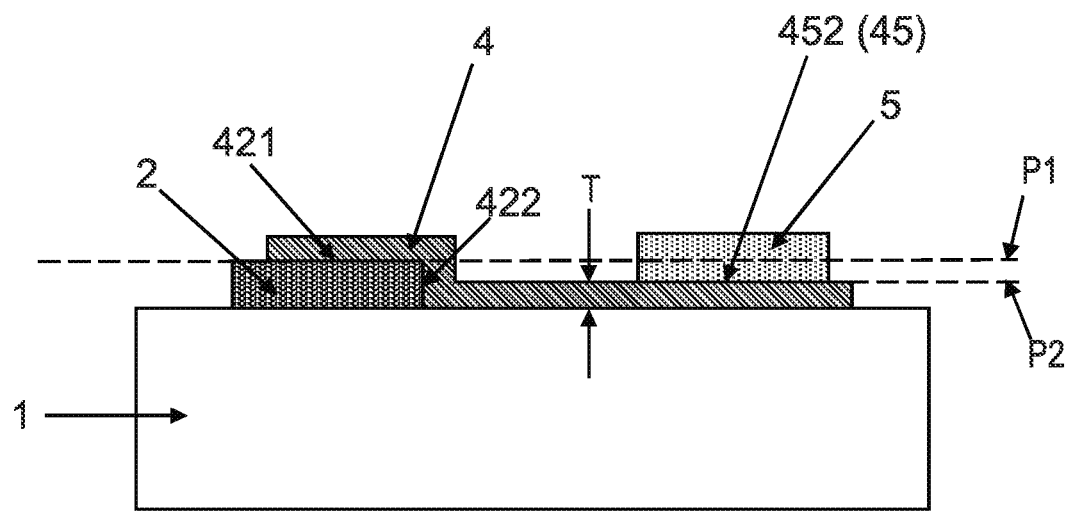
FIG. 13 illustrates another Schottky diode embodying an aspect of the present invention.

Referring now to FIG. 13, this shows a cross section of another embodiment of an aspect of the invention defined generally by claim 20. Here, the first electrode 2 is formed generally beneath the semiconductor layer or body 4, and the second electrode 5 is formed generally on top of the semiconductor body 4. A portion of the semiconductor layer 4 overlaps an upper surface of the first electrode 2, such that the interface between the semiconductor 4 and the first electrode 2 comprises a first planar region 421 lying in a first plane P1. In this example, the thickness of the layer of semiconductor material 4 (that thickness being indicated in the figure by T) is less than the thickness of the first electrode 2, hence the second planar region 452 (which forms the entirety of the second interface 45 between the second electrode 5 and semiconductor 4) lies in a second plane P2, separated from plane P1 in a direction normal to P1. In this example, P2 is nominally beneath P1 but it will be appreciated that in alternative embodiments the relative positions of planes P1 and P2 will vary, depending on the relative thicknesses of the electrodes and semiconductor body 4.

Figure 14:
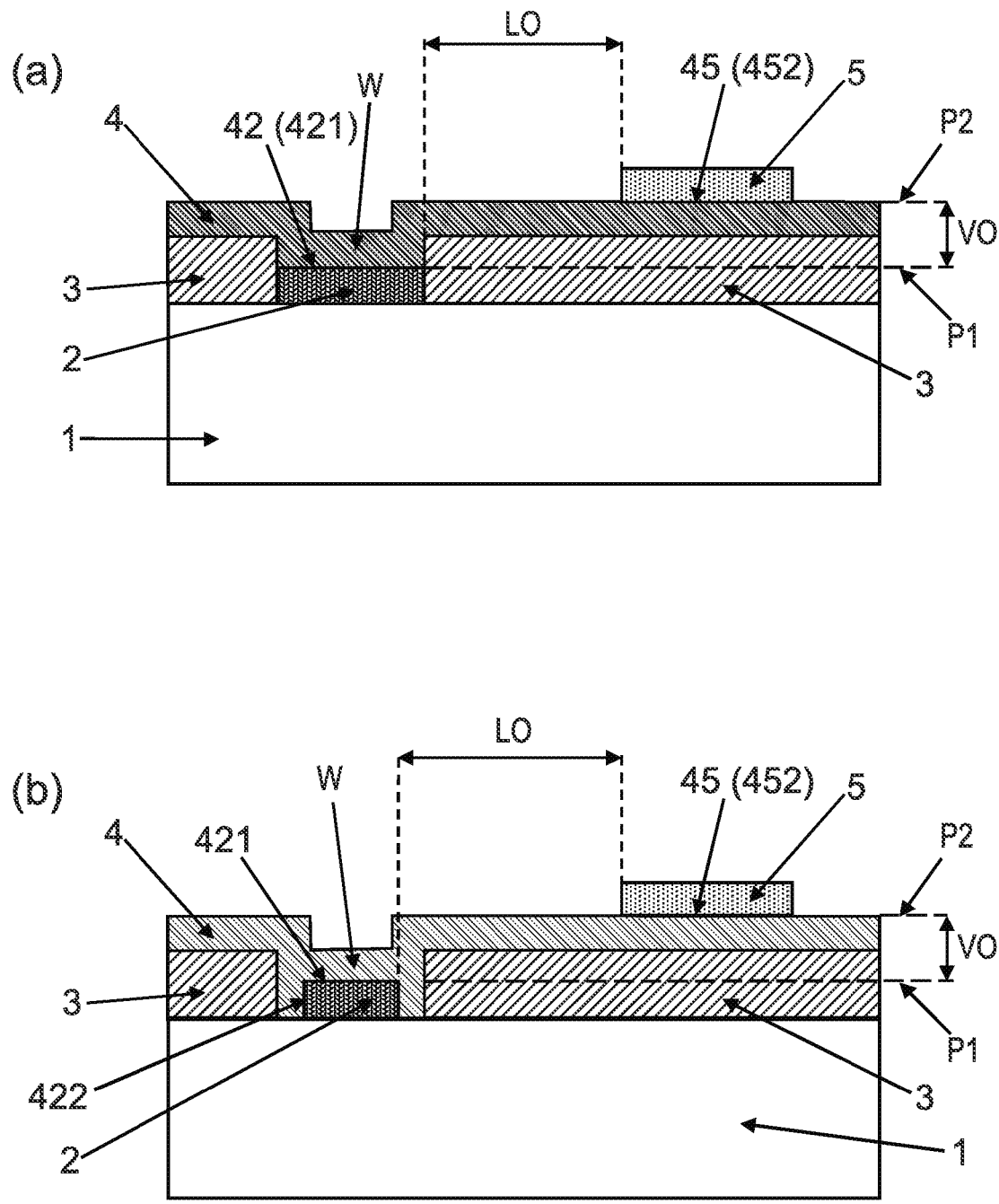
FIG. 14 illustrates another two Schottky diodes embodying an aspect of the present invention.

Referring now to FIG. 14(a), this shows a cross section of another Schottky diode embodying the invention. This embodiment differs from certain previously described embodiments in that the dielectric layer 3 does not cover any portion of the first electrode 2. Instead, the device has been produced using a method in which the dielectric layer 3 has first been formed on the substrate 1, and a window W has been formed through the dielectric layer, extending down to the surface (upper surface in this figure) of the substrate 1. Then, conductive material has been deposited inside the window W to form the first electrode 2. A layer or body 4 of semiconductor material has then been formed over the structure, so that the semiconductor material fills the window W, forms a first interface 42 with the first electrode 2, and extends laterally, in this example in both directions away from the window W. Thus, in this example the projection of the first electrode 2 onto the plane P1 is exactly the same as the projection of the first planar region 421. In other words, the first planar region 421 is the entirety of the first interface 42. A second electrode 5 has then been formed by a suitable technique (for example by deposition, masking, and then etching; or alternatively by selective printing) on the upper surface of the semiconductor body 4. Thus, in this example the second planar region 452 provides the entirety of the second interface 45 between the second electrode 5 and the semiconductor 4, and the projection of the second electrode 5 onto plane P1 is the same as the projection of second planar region 452. As with certain previous embodiments, the plane P2 of the second electrode contact with the semiconductor layer 4 is parallel to the plane P1 of the contact or junction between the semiconductor 4 and the first electrode 2. The first and second planar regions 421 and 452 are vertically offset by a distance VO, and are laterally offset by a distance LO. Referring now to FIG. 14(b), this shows another Schottky diode embodying the invention. Similarly to the embodiment shown in FIG. 14(a), the dielectric layer 3 does not cover any portion of the first electrode 2. However in this embodiment the first electrode 2 does not fill the whole of window W in the dielectric layer 3, rather it fills a portion of the window W. First electrode 2 may be formed by any suitable technique, either prior to or after formation of the dielectric layer 3. A layer or body 4 of semiconductor material has then been formed over the structure, so that the semiconductor material fills the window W, forms a first interface 42 with the first electrode 2, and extends laterally, in this example in both directions away from the window W. Thus, in this embodiment the projection of the first electrode 2 onto the plane P1 is exactly the same as the projection of the first planar region 421. However, in this embodiment the first interface 42 comprises the first planar region 421 and edge portion 422.

Figure 15:
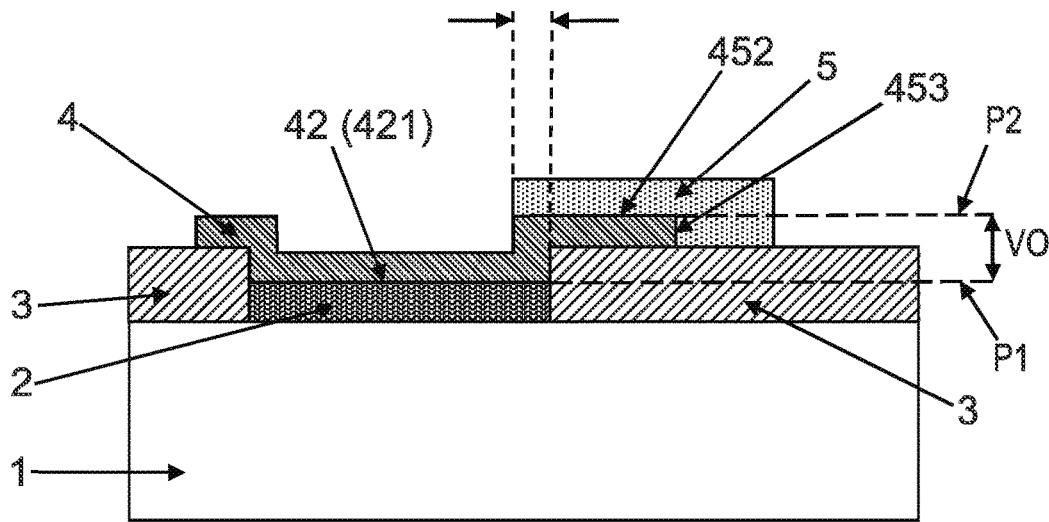
FIG. 15 illustrates another Schottky diode embodying an aspect of the present invention.

Referring now to FIG. 15, this shows another Schottky diode embodying an aspect of the present invention; a structure with a dielectric layer. The dielectric layer 3 is formed so as to surround the first electrode 2, but does not overlap it. A layer (or body) of semiconductor 4 is formed so as to cover the exposed first electrode upper surface (forming the first interface 42 which consists of the first planar region 421 in the plane P1), and cover portions of the dielectric layer around (i.e. adjacent) the first electrode. A second electrode 5 has been formed over a portion of the semiconductor layer 4 and over a portion of the dielectric layer 3, forming a second interface 45 with the semiconductor material which comprises a second planar region 452, lying in plane P2, and a further region 453, generally at an edge of the semiconductor layer. In this example, the second planar region 452 partially overlaps the first planar region 421, and hence partially overlaps the first electrode 2.

The ability of the approach to provide devices having different characteristics on the same wafer purely by varying their lateral geometry is advantageous, for example in minimising the number of process steps required to produce devices optimised for a range of applications in the same integrated circuit (see description accompanying FIGS. 6 and 9).

Figure 16:
FIGS. 16-19 illustrate methods, embodying aspects of the invention, of manufacturing a Schottky diode.
Figure 16:
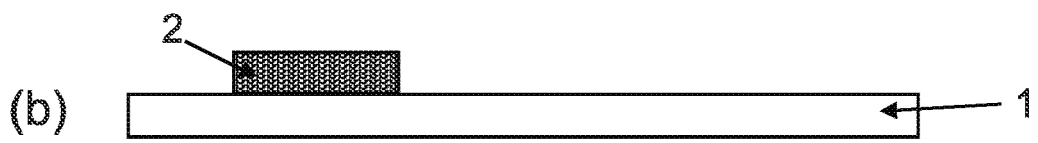
Figure 16:
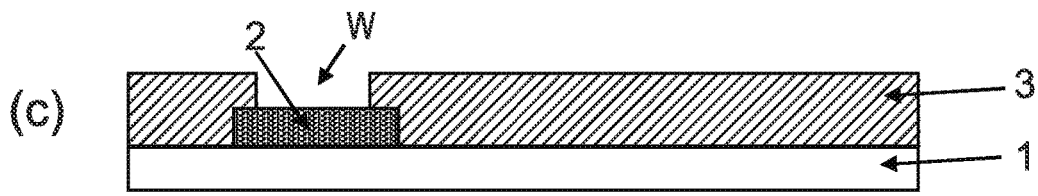
Figure 16:
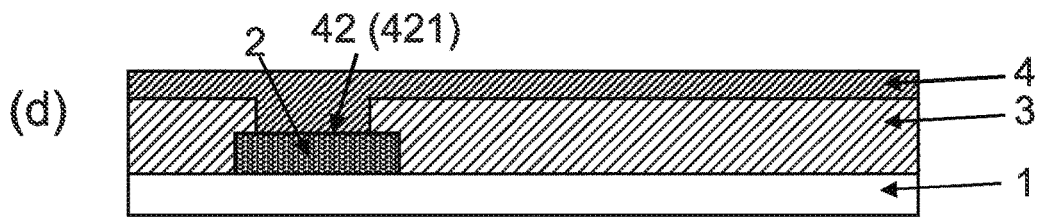
Figure 16:
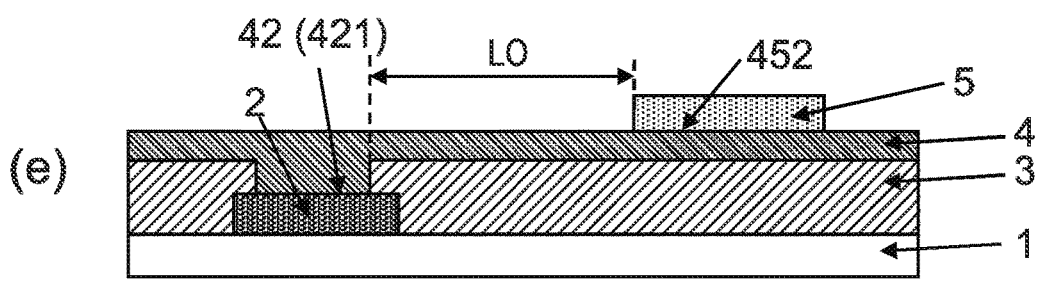

Referring now to FIG. 16, this illustrates a method embodying one aspect of the invention. The method comprises: (a) providing a substrate 1 (or other support/supporting structure); (b) forming a first electrode 2 on a first region of a surface of the substrate; (c) forming a body of dielectric material 3 covering a second region of the substrate surface adjacent the first region, the body 3 also having a window W through which a portion of a surface of the first electrode 2 is visible/exposed; (d) forming a body of semiconductive material 4 comprising a first portion, filling the window and arranged over the first electrode and connected to the first electrode at a first interface 42 (421), and a second portion arranged over a portion of the body of dielectric material covering said second region of the substrate surface; and (e) forming a second electrode 5 on said second portion of the body of semiconductive material, the second electrode being connected to the body of semiconductive material at a second interface 452. The method includes setting the lateral offset LO between the first interface 42 and the second interface 452 so as to achieve a desired characteristic of the diode.

Figure 17:
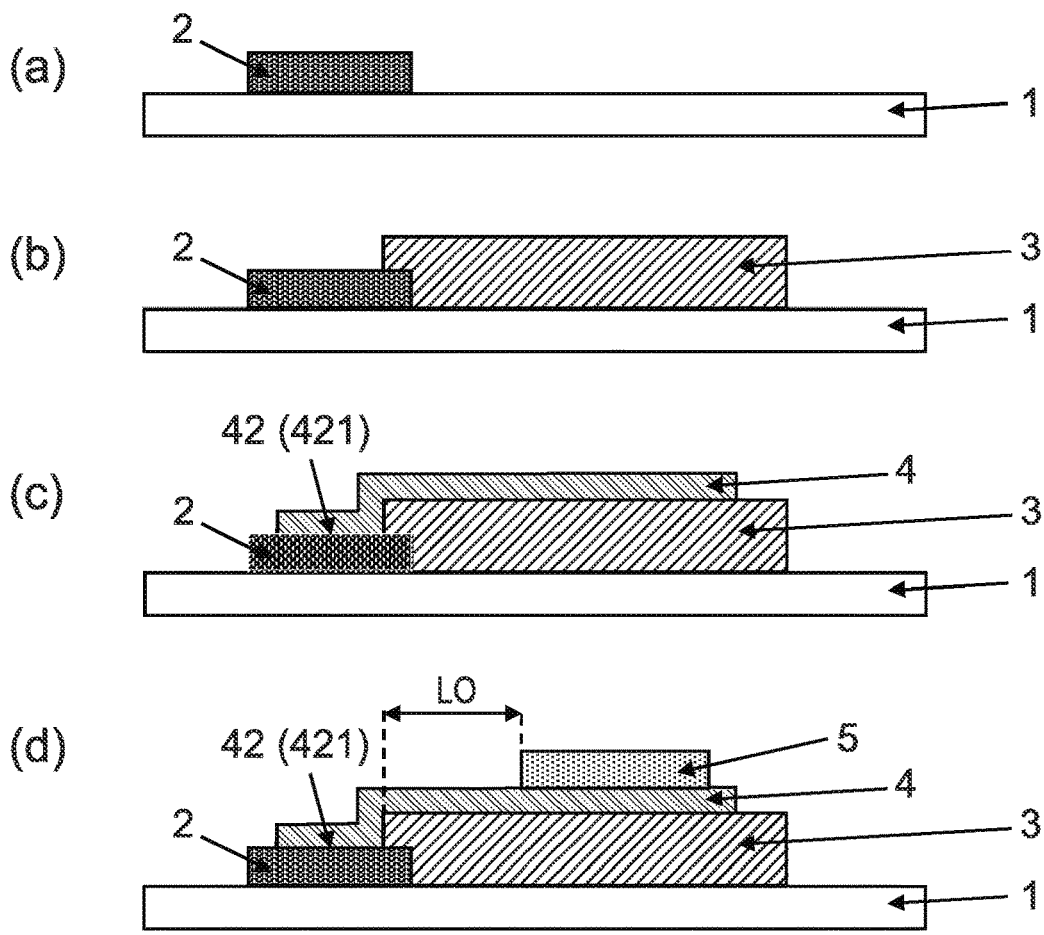

Referring to FIG. 17, this illustrates another method embodying an aspect of the invention, similar to that illustrated by FIG. 16, but differing in that the body of dielectric material 3 does not provide a window. Instead, the body 3 partially overlaps the first electrode, then extends laterally to cover a second portion of the substrate surface immediately adjacent the first portion (covered by the first electrode). The body 4 of semiconductive material is then formed (step (c)) so as to overlap an uncovered portion of the first electrode's upper surface and cover at least a portion of the dielectric material covering the second region of the substrate surface. Then, in step (d), the second electrode 5 is formed on a surface of the second portion of the semiconductive body, with a desired lateral offset LO between the first and second interfaces.

Figure 18:
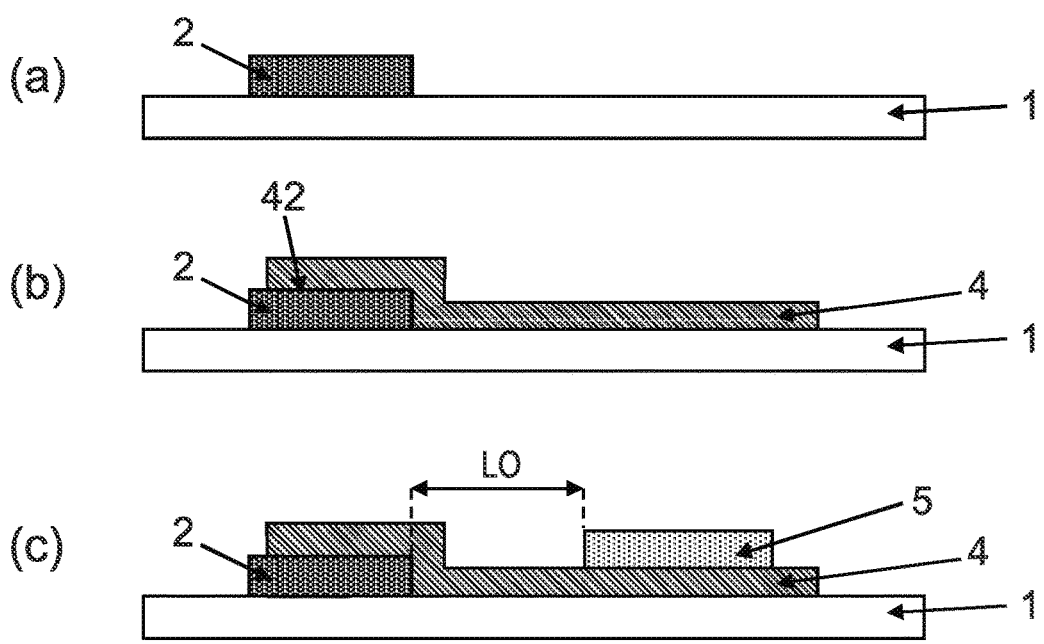

Referring now to FIG. 18, this illustrates another method embodying an aspect of the invention, for manufacturing a Schottky diode comprising a first electrode, a second electrode, and a body of semiconductive material connecting the first and second electrode. The method comprises: (a) forming a first electrode 2 on a first region of a substrate 1 (or support) surface; (b) forming a body of semiconductive material 4 comprising a first portion, arranged over the first electrode and connected to the first electrode at a first interface 42, and a second portion arranged over a second region of the substrate surface adjacent the first region; and forming a second electrode 5 on said second portion of the body of semiconductive material, the second electrode being connected to the body of semiconductive material at a second interface. Again, the lateral offset LO between the first and second interfaces is selected to determine the device characteristsics.

Figure 19:
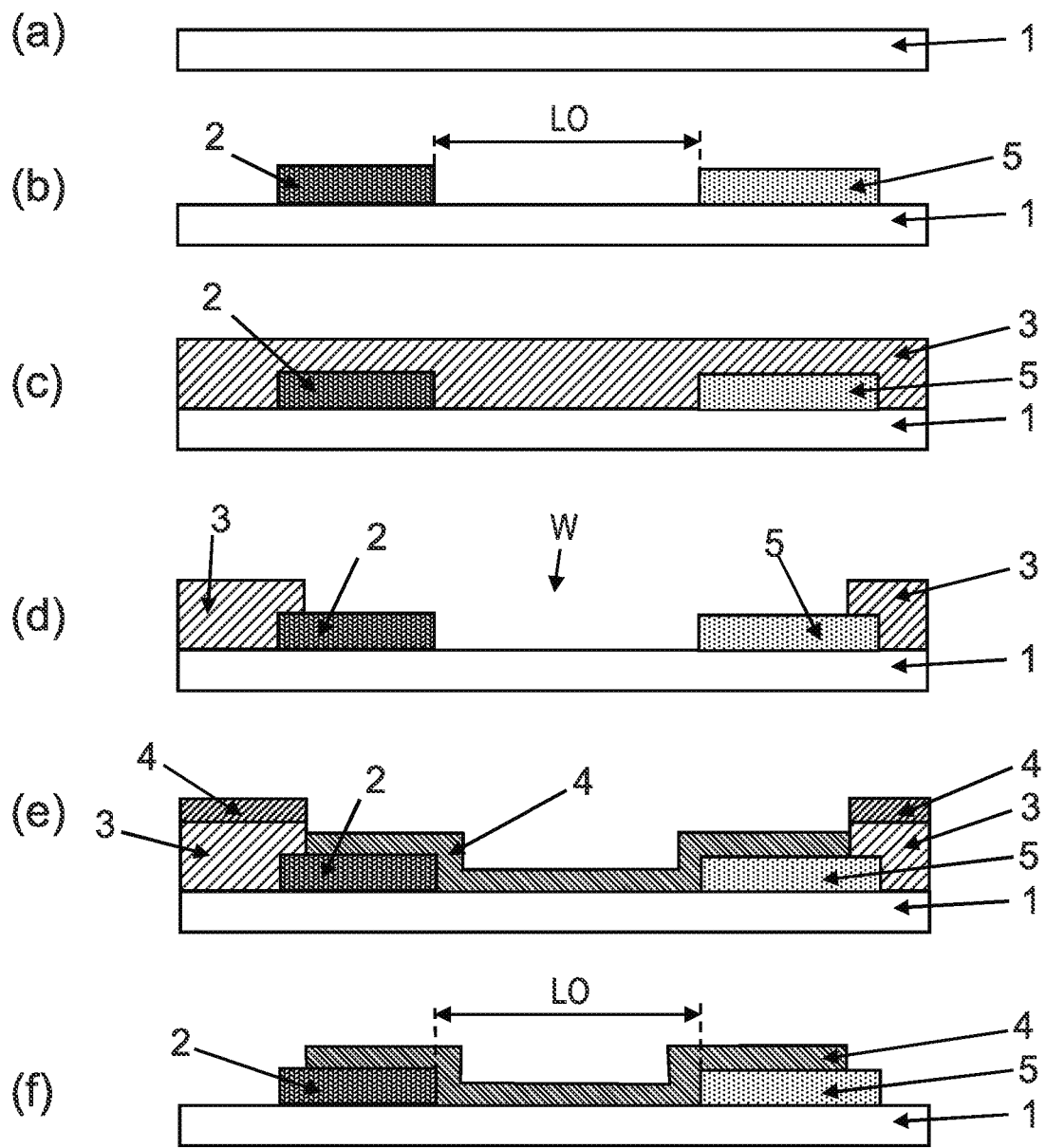

Referring now to FIG. 19, this illustrates another method embodying an aspect of the invention. The method comprises: (a) providing a substrate 1 (or support/supporting structure); (b) forming a first electrode 2 on a first region of a surface of the substrate and forming a second electrode 5 on a second region of the substrate surface, the second region being separated from the first region by a third region, and the electrodes having a desired lateral offset; (c) forming a body of dielectric material 3 to cover at least the electrodes and the third region of the substrate; (d) forming a window W in the body of dielectric material to expose portions of the electrodes and the third region of the substrate surface; (e) depositing semiconductive material 4 at least inside the window; and (f) removing remaining dielectric material 3. The method thus forms a body of semiconductive material 4 comprising a first portion, arranged over the first electrode and connected to the first electrode at a first interface, a second portion arranged over the second electrode and connected to the second electrode at a second interface, and a third portion arranged over the third region and connecting the first portion to the second portion. In certain embodiments, the electrodes may be formed (e.g. deposited or printed) at the same time, but in alternative embodiments are formed one before the other. Their upper surfaces may be processed before depositing the dielectric and/or semiconductive materials so as to achieve the desired surface characteristic to achieve one rectifying and one ohmic contact in the eventual diode.

Figure 20:
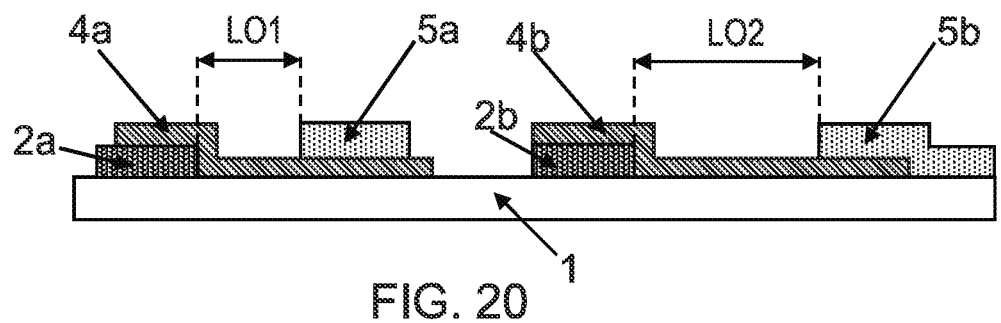
FIG. 20 illustrates part of a circuit embodying an aspect of the invention, and incorporating two Schottky diodes.

Referring now to FIG. 20, this illustrates part of a circuit embodying an aspect of the invention. Two Schottky diodes have been formed on a common substrate 1 at the same time. In other words, the first electrodes 2a and 2b were formed in a single respective processing step; as were the two semiconductive bodies 4a and 4b, and as were the two second electrodes 5a and 5b. Thus, the two diodes were manufactured in a method requiring only the same number of processing steps as for producing a single diode. The lateral offsets LO1 and LO2 are, however, different. Thus, in an efficient manner, the method embodying an aspect of the invention has been able to manufacture a plurality of diodes, with different electrical characteristics, on a single substrate, without needing additional processing steps compared with a method of manufacturing just a single diode, simply by determining the respective lateral offsets of the devices' electrodes.

As will be understood by the skilled person, other and/or additional aspects of the geometric design of each device may be different from those of other devices in the same circuit. For example, the width in a direction parallel to the surface of the substrate 1 but perpendicular to the lateral offset LO (i.e. in a direction perpendicular to the plane of the page), of the semiconductive bodies and/or of the first and/or second electrodes may differ from those of other devices in the circuit. An individual device within a circuit containing a plurality of devices may feature elements of any of the devices disclosed in the present description. For example a device may differ from others in the presence, absence or geometry of any body of dielectric material 3, or the presence, absence or geometry of any window W in any body of dielectric material 3.

Figure 21:
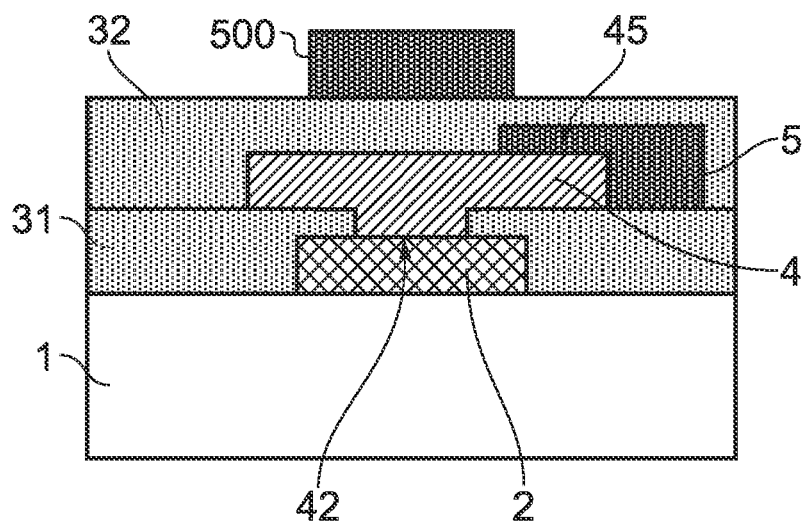
FIG. 21 illustrates a source-gated transistor (SGT) embodying the invention.

Schottky diodes/devices and methods in accordance with any of the above-mentioned aspects and embodiments may be incorporated in, or incorporated in methods of manufacturing, more complex devices, for example source-gated transistors, Schottky transistors, gated diodes, etc. For example, FIG. 21 illustrates a source-gated transistor (SGT) incorporating a Schottky diode embodying an aspect of the invention. The SGT source electrode 2 is formed/provided on a substrate 1, and a barrier contact 42 is provided by an interface between part of the upper surface of the SGT source electrode and part of a body of semiconductive material 4. This body 4 of semiconductor is formed over a first dielectric layer 31, and contacts the source electrode via a window in the first dielectric layer 31. Thus, the semiconductor fills the window and extends laterally, over upper surfaces of the first dielectric layer 31. The SGT further comprises an SGT drain electrode 5, overlapping an upper edge of the semiconductor body 4, and forming an ohmic contact 45 to the semiconductor (in other words, the ohmic contact is provided by the interface between the drain electrode and the semiconductor body 4). A second dielectric layer 32 is formed over the semiconductor body and drain electrode, and an SGT gate electrode 500 is formed on a surface of the second dielectric layer 32. In this example, the gate electrode 500 is aligned so that it does not overlap the drain electrode 5, but is positioned over the semiconductor layer 4 and separated from the semiconductor material by the second dielectric layer 32. A method of manufacturing the SGT may comprise manufacturing the Schottky diode components (2, 31, 4, 5) using a method in accordance with another aspect/embodiment, forming the second dielectric layer 32 over the semiconductor layer 4 and drain electrode 5, and forming the gate on a surface of the second dielectric layer.

Figure 22:
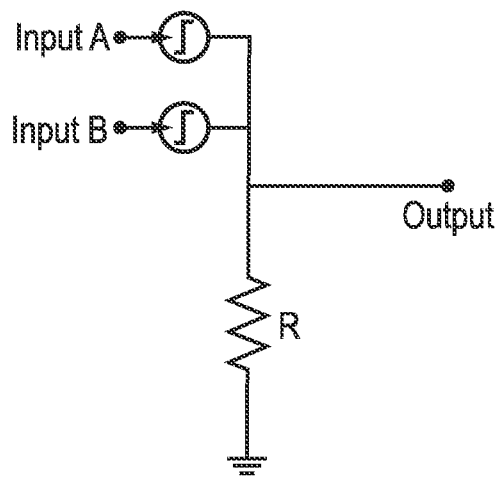
FIG. 22 illustrates a diode OR gate embodying an aspect of the invention, and incorporating Schottky diodes embodying an aspect of the invention.
Figure 23:
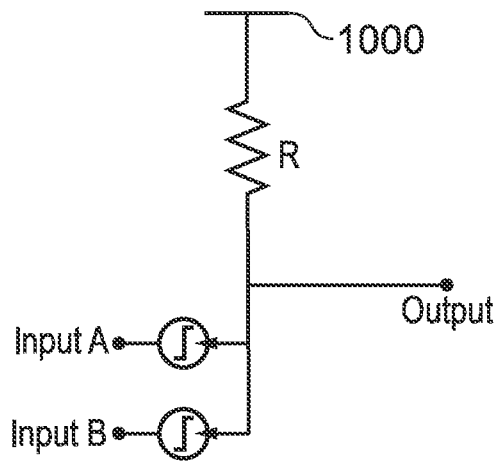
FIG. 23 illustrates a diode AND gate embodying an aspect of the invention, and incorporating Schottky diodes embodying an aspect of the invention.

It will be appreciated that Schottky diodes embodying aspects of the invention may be incorporated in a wide variety of circuits, circuit modules, and electronic devices, for example in the form of integrated circuits (ICs). Schottky diodes embodying aspects of the invention may be incorporated in logic gates. Such logic gates may comprise one or more diodes, either as the sole active elements (e.g. in "diode logic") or in combination with transistors ("diode-transistor logic"). Two diode logic examples incorporating Schottky diodes embodying aspects of the invention are shown in FIGS. 22 and 23. FIG. 22 illustrates a diode OR gate embodying an aspect of the invention, and comprising two diodes, each having a respective anode connected to a respective input terminal, and a respective cathode connected to an output terminal. The output terminal is connected to ground via a resistor. FIG. 23 illustrates a diode AND gate embodying an aspect of the invention, and comprising two diodes, each having a respective cathode connected to a respective input terminal, and a respective anode connected to an output terminal. The output terminal is connected to a positive supply rail 1000 via a resistor. The use of Schottky diodes in logic gates (as in these embodiments, for example) may provide advantages of fast response and small voltage drop, as well as other benefits.

Figure 24:
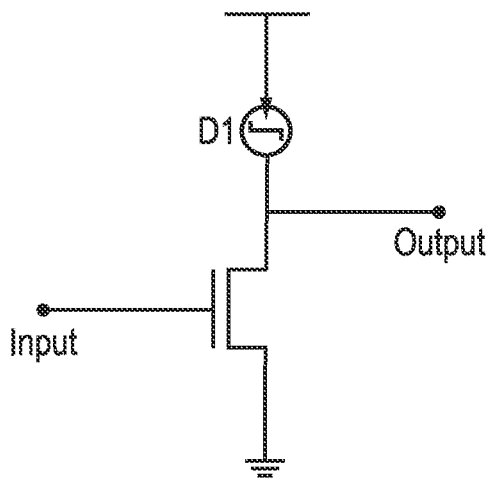
FIG. 24 illustrates a diode load inverter embodying an aspect of the invention, and incorporating a Schottky diode embodying an aspect of the invention.

Schottky diodes embodying aspects of the invention may also be incorporated in diode load inverters, such as that illustrated in FIG. 24. A conventional unipolar inverter typically places a transistor switch and resistor load between high and low voltage references. The inverter input is connected to the transistor gate terminal, and the inverter output is connected to the junction of the transistor and the resistor. In a diode load inverter, the resistor load is replaced by a diode, for example as shown in FIG. 24. The use of a Schottky diode embodying an aspect of the invention as a load in a diode load inverter, such as shown in FIG. 24, may provide benefits of fast switching, low voltage drop and low power consumption, among others.

Figure 25:
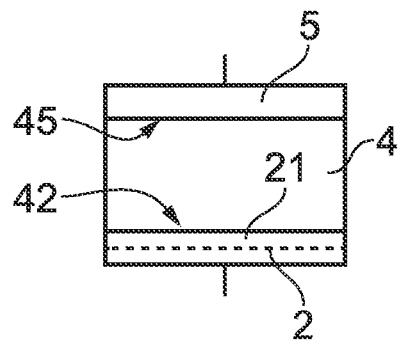
FIG. 25 illustrates a Schottky diode embodying another aspect of the invention.

Referring to FIG. 25, this illustrates another Schottky diode embodying an aspect of the present invention, and which may be manufactured by methods, and incorporated in circuits and devices, embodying other aspects of the invention. The diode comprises a first electrode 2; a second electrode 5; and a body 4 of semiconductive material connected to the first electrode at a first interface 42 and connected to the second electrode at a second interface 45, wherein the first interface 42 provides a Schottky contact. The first electrode 2 comprises a body (e.g. layer) of titanium and a layer of titanium oxide 21 (i.e. a layer comprising, or consisting of, at least one titanium oxide or suboxide, as discussed above) formed on a surface of the body of titanium, and the first interface 42 consists of an interface between the body 4 of semiconductive material and the layer of titanium oxide 21. In this example, the semiconductive material 4 is an oxide semiconductor, more particularly IGZO, although other semiconductive materials may be employed in alternative embodiments.

It will be appreciated from the above description that certain lateral diodes described herein and embodying the present invention differ from the lateral diodes of the prior art in that the metal contacts are laterally as well as vertically separated, with a semiconductor layer sandwiched in between. This allows the structures to be easily included in a manufacturing process, minimising additional processing steps and reducing cost. This offers several critical advantages;

This configuration allows precise control of the threshold voltage and breakdown voltage of the diode by controlling separation between the Ohmic and Schottky contacts (increased by increasing the separation) without the need to change material or surface properties. This means that, for example, diodes with different threshold and/or breakdown voltages can be manufactured in the same process on the same substrate, without requiring different semiconductor thicknesses, oxygen concentrations or surface treatments. Precise control of resistance- and capacitance-related device properties, such as contact resistance, series resistance, maximum current level, capacitance and RC time constant may also be provided by control of the device geometry.

The configuration is easier to manufacture because the conductor layers are vertically separated allowing greater choice of material through reduced issues around etch selectivity. The two conductor layers here are separated by a dielectric layer. This dielectric layer provides vertical separation between the two conductor layers, the bottom conductor layer is therefore protected from any processes carried out on the top conductor layer (chemical, physical etch, etc.). Compared to purely vertical and lateral approaches, here etch selectivity considerations of the two conductor layers does not impact selection of conductor layers that can be used allowing for greater choice of materials.

In the case of metal oxide semiconductors, local reduction of the semiconductor by the ohmic contact is less likely to create current pathways that reach the Schottky contact, providing a more robust process that is less dependent on thickness and/or oxygen content of the metal oxide. This is because that local reduction is confined essentially to just the portion of the semiconductor layer directly under the ohmic contact, which in certain embodiments is laterally separated from the Schottky contact. The reduction may extend a little in the lateral direction, at the edge of the ohmic contact, but if the lateral separation of the two contacts is large enough this will ensure that a conductive pathway extending all the way from the ohmic contact to the Schottky contact cannot be formed. In other words, control of the lateral separation of the two contacts can ensure that a conductive pathway extending all the way from the ohmic contact to the Schottky contact is avoided.

Materials

In certain embodiments the layer of semiconductor material is a thin film, for example a thin film of semiconductor material selected from a list comprising: compound semiconductors (such as GaAs, GaN, InP, CdSe, InGaAs, InGaAsSb), metal oxides such as ZnO, SnO2, NiO, SnO, Cu2O, In2O3, LiZnO, ZnSnO, InSnO (ITO), InZnO (IZO), HfInZnO (HIZO), InGaZnO (IGZO); metal oxynitrides, e.g. ZnxOyNz; inorganic semiconductors (such as amorphous, microcrystalline or nanocrystalline Si); organic semiconductors (such as CuPc, pentacene, PTCDA, methylene blue, Orange G, rubrene); polymer semiconductors (such as PEDOT:PSS, POT, P3OT, P3HT, polyaniline, polycarbazole); 2D materials (such as graphene); chalcogenides such as MoS2, GeSbTe; and perovskites (SrTiO3, CH3NH3PbCl3, H2NCHNH2PbCl3, CsSnI3). These semiconductor materials may also be doped or contain a doping gradient and may be n-type or p-type.

In certain embodiments the layer of conductive material may comprise a metal such as Au, Ti, Al, Mo, Pt, Pd, Ag, Cu, Ni, Cr, Ta, W; a metal alloy such as MoNi, MoCr, AlSi; a transparent conductive oxide (such as ITO, IZO, AZO); a metal nitride such as TiN; a carbon material such as carbon black, carbon nanotubes, graphene; a conducting polymer such as polyaniline, PEDOT:PSS; or a semiconductor material.

In certain embodiments the layer of dielectric material comprises: A metal oxide such as $Al_2O_3$, ZrO2, HfO2, Y2O3, Si3N5, TiO2, Ta2O5; a metal phosphate such as Al2POPx; a metal sulphate/sulphite such as HfSOx; a metal nitride such as AlN; a metal oxynitride such as AlOxNy; an inorganic insulator such as SiO2, Si3N4, SiNx; spin on glass (such as polyhydroxybenzyl silsesquioxane, HSQ), polymeric dielectric materials (such as Cytop (a commercially available amorphous fluoropolymer), 1-Methoxy-2-propyl acetate (SU-8), benzocyclobutene (BCB), polyimide, polymethyl methacrylate, polybutyl methacrylate, polyethyl methacrylate, polyvinyl acetate, polyvinyl pyrrolidone, polyvinylphenol, polyvinylchloride, polystyrene, polyethylene, polyvinyl alcohol, polycarbonate, parylene, silicone,); a UV-curable resin; a Nanoimprint resist; or a photoresist. The dielectric material may have a relatively low dielectric constant (low-K, e.g. Cytop, HSQ, parylene) or a relatively high dielectric constant (high-κ, e.g. Ta2O5, HfO2).

In certain embodiments, the Schottky diode may be provided on a substrate or substrate structure. In other words, the method may further comprise supporting the Schottky diode either directly or indirectly on a substrate. In certain embodiments, the substrate may be flexible, and the substrate may comprise a material selected from a list comprising: glass (rigid or flexible); polymer (e.g. polyethylene naphthalate or polyethylene terephthalate); polymeric foil; paper; insulator coated metal (e.g. coated stainless-steel); cellulose; polymethyl methacrylate; polycarbonate, polyvinylalcohol; polyvinyl acetate; polyvinyl pyrrolidone; polyvinylphenol; polyvinyl chloride; polystyrene; polyethylene naphthalate; polyethylene terephthalate; polyimide, polyamide (e.g. Nylon); poly(hydroxyether); polyurethane; polycarbonate; polysulfone; parylene; polyarylate; polyether ether ketone (PEEK); acrylonitrile butadiene styrene; 1-Methoxy-2-propyl acetate (SU-8); polyhydroxybenzyl silsesquioxane (HSQ); Benzocyclobutene (BCB); Al2O3, SiOxNy; SiO2; Si3N4; UV-curable resin; Nanoimprint resist; photoresist.

In certain embodiments, the providing of the layer of substrate/semiconductor/conductor/dielectric material comprises forming said layer by a technique selected from a list comprising: vapour deposition (physical e.g. sputter; chemical e.g. PECVD); vacuum deposition (e.g. thermal or e-beam evaporation); coating (spin, dip, blade, bar, spray, slot-die); printing (jet, gravure, offset, screen, flexo); pulsed-laser deposition (PLD); atomic-layer deposition (ALD) coating.

In certain embodiments, the layer of substrate/semiconductor/conductor/dielectric material may have surface modification by techniques such as thermal annealing, plasma treatment (such as O2, Cl2, Ar, CF4, BCl3, N2, SF6, HBr), self-assembled monolayers SAM (such as HMDS) RIE, ozone UV treatment.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A Schottky diode comprising:
   a first electrode;
   a second electrode;
   a body of semiconductive material connected to the first electrode at a first interface and connected to the second electrode at a second interface; and
   a body of dielectric material,
   wherein
   the first interface comprises a first planar region lying in a first plane and the first electrode has a first projection onto the first plane in a first direction normal to the first plane,
   the second interface comprises a second planar region lying in a second plane and the second electrode has a second projection onto the first plane in said first direction,
   at least a portion of the second projection lies outside the first projection,
   said second planar region is offset from the first planar region in said first direction, and
   one of the first interface and the second interface provides a Schottky contact, wherein said body of dielectric material comprises a window, and said first interface is arranged inside said window, wherein said body of semiconductive material comprises a first portion, at least partly filling said window, and a second portion extending laterally from the window and covering at least a portion of a service of said body of dielectric material, and wherein said second electrode is arranged to cover at least part of the second portion of the body of semiconductive material.

2. The diode in accordance with claim 1, wherein said second projection lies entirely outside said first projection, whereby a projection, in the first direction, of the second planar region onto the first plane lies completely outside a projection, in the first direction, of the first planar region onto the first plane.

3. The diode in accordance with claim 1, wherein a portion of said first projection lies inside said second projection.

4. The diode in accordance with claim 3, wherein a projection, in the first direction, of the second planar region onto the first plane lies completely outside a projection, in the first direction, of the first planar region onto the first plane.

5. The diode in accordance with claim 3, wherein a portion of a projection, in the first direction, of the first planar region onto the first plane lies inside a projection, in the first direction, of the second planar region onto the first plane.

6. The diode in accordance with claim 1, further comprising a substrate, said first electrode being arranged on a surface of said substrate.

7. The diode in accordance with claim 1, wherein said body of dielectric material is arranged to space the second electrode from the first electrode in said first direction.

8. The diode in accordance with claim 1, wherein the body of semiconductive material comprises a first layer and a second layer, the first interface comprising a portion of the first layer, and the second interface comprising a portion of the second layer.

9. A circuit comprising:
a first and a second diode each comprising:
 a first electrode;
 a second electrode; and
 a body of semi conductive material connected to the first electrode at a first interface and connected to the second electrode at a second interface; and
wherein
 the first interface comprises a first planar region lying in a first plane and the first electrode has a first projection onto the first plane in a first direction normal to the first plane,
 the second interface comprises a second planar region lying in a second plane and the second electrode has a second projection onto the first plane in said first direction,
 at least a portion of the second projection lies outside the first projection,
 said second planar region is offset from the first planar region in said first direction, and
 one of the first interface and the second interface provides a Schottky contact, wherein the first and second planar regions of the first diode are offset from each other by a first distance and the first and second planar regions of the second diode are offset by a second distance from each other, said second distance being different from the first distance, and/or wherein the circuit is an integrated circuit.

* * * * *